United States Patent
Hatakeyama et al.

(10) Patent No.: US 9,663,656 B2
(45) Date of Patent: May 30, 2017

(54) CONDUCTIVE POLYMER MATERIAL AND SUBSTRATE

(71) Applicant: SHIN-ETSU CHEMICAL CO., LTD., Tokyo (JP)

(72) Inventors: Jun Hatakeyama, Jyoetsu (JP); Takayuki Nagasawa, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 13 days.

(21) Appl. No.: 14/831,452

(22) Filed: Aug. 20, 2015

(65) Prior Publication Data
US 2016/0075875 A1    Mar. 17, 2016

(30) Foreign Application Priority Data

Sep. 12, 2014   (JP) .................. 2014-186310
Jul. 6, 2015    (JP) .................. 2015-135142

(51) Int. Cl.
| | |
|---|---|
| H01B 1/04 | (2006.01) |
| C08L 81/02 | (2006.01) |
| H01B 1/12 | (2006.01) |
| C08L 65/00 | (2006.01) |
| H01L 51/00 | (2006.01) |

(52) U.S. Cl.
CPC .............. *C08L 81/02* (2013.01); *C08L 65/00* (2013.01); *H01B 1/125* (2013.01); *H01L 51/0037* (2013.01); *C08G 2261/1424* (2013.01); *C08G 2261/314* (2013.01); *C08G 2261/3221* (2013.01); *C08G 2261/3223* (2013.01); *C08G 2261/3225* (2013.01); *C08G 2261/3226* (2013.01); *C08G 2261/512* (2013.01); *C08G 2261/794* (2013.01)

(58) Field of Classification Search
CPC .......... C08L 65/00; C08L 25/18; C08L 33/16; C08L 81/02; C08K 5/03; C08K 5/09; C08G 2261/1424; C08G 2261/314; C08G 2261/3221; C08G 2261/3223; C08G 2261/3225; C08G 2261/3226; C08G 2261/512
See application file for complete search history.

(56) References Cited

U.S. PATENT DOCUMENTS

| | | | | |
|---|---|---|---|---|
| 5,198,153 | A * | 3/1993 | Angelopoulos | C08G 61/12 252/500 |
| 5,202,061 | A * | 4/1993 | Angelopoulos | C08G 61/12 252/500 |
| 7,851,115 | B2 * | 12/2010 | Wu | G03G 5/047 430/65 |
| 9,063,414 | B2 * | 6/2015 | Ichikawa | G03F 7/0045 |
| 2006/0047030 | A1 | 3/2006 | Yoshida et al. | |
| 2009/0256117 | A1* | 10/2009 | Seshadri | C08G 61/126 252/500 |
| 2012/0012795 | A1 | 1/2012 | Hsu | |
| 2014/0060602 | A1* | 3/2014 | Aoai | B82Y 30/00 136/205 |

FOREIGN PATENT DOCUMENTS

| | | |
|---|---|---|
| JP | 2006-096975 A | 4/2006 |
| JP | 2006-321840 A | 11/2006 |
| JP | 2008-146913 A | 6/2008 |
| JP | 5264723 B2 | 8/2013 |
| JP | 2013-228447 A | 11/2013 |
| JP | 2014-015550 A | 1/2014 |

* cited by examiner

*Primary Examiner* — Jaison Thomas
(74) *Attorney, Agent, or Firm* — Oliff PLC

(57) ABSTRACT

A conductive polymer material includes a π-conjugated polymer, dopant polymer which contains a repeating unit having a sulfo group and has a weight-average molecular weight in the range of 1,000 to 500,000, and amphoteric ion compound represented by the following general formula (1), (1)

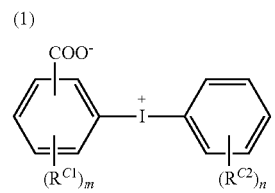

wherein $R^{C1}$ and $R^{C2}$ independently represent a linear, branched, or cyclic alkyl group having 1 to 10 carbon atoms, a linear, branched, or cyclic alkoxy group having 1 to 10 carbon atoms, an acyl group having 2 to 10 carbon atoms, an acyloxy group having 2 to 10 carbon atoms, an alkoxycarbonyl group having 2 to 10 carbon atoms, a hydroxyl group, a nitro group, a halogen atom; and "m" and "n" are each an integer of 0 to 4. A conductive polymer material with low acidity that suppresses the agglomeration of particles with overtime, with an excellent stability in a solution state can be provided.

20 Claims, No Drawings

CONDUCTIVE POLYMER MATERIAL AND SUBSTRATE

BACKGROUND OF THE INVENTION

Field of the Invention

The present invention relates to a conductive polymer material and a substrate having a conductive film formed thereon by using the conductive polymer material.

Description of the Related Art

A polymer having a conjugated double bond (i.e. π-conjugated polymer) does not show a conductivity by itself; however, if an appropriate anionic molecule is doped therein, it can express a conductivity, thereby giving a conductive polymer material (i.e. conductive polymer composition). As to the π-conjugated polymer, polyacetylene; (hetero) aromatic polymers such as polythiophene, polyselenophene, polytellurophene, polypyrrole, and polyaniline; a mixture thereof, etc., are used; and as to the anionic molecule (dopant), an anion of sulfonic acid type is most commonly used. This is because a sulfonic acid, which is a strong acid, can efficiently interact with the aforementioned π-conjugated polymers.

As to the anionic dopant of sulfonic acid type, sulfonic acid polymers such as polyvinyl sulfonic acid and polystyrene sulfonic acid (PSS) are widely used (Patent Document 1). The sulfonic acid polymer includes a vinylperfluoroalkyl ether sulfonic acid typified by Nafion (registered trademark), which is used for a fuel cell.

Polystyrene sulfonic acid (PSS), which is a homopolymer of a sulfonic acid, has a sulfonic acid as a repeated monomer unit in the polymer main chain, so that it has a high doping effect to the π-conjugated polymer, and also can enhance water dispersibility of the π-conjugated polymer after being doped. This is because the hydrophilicity is kept due to the sulfo groups excessively present in PSS, and the dispersibility into water is therefore enhanced dramatically.

Polythiophene having PSS as a dopant exhibits high conductivity and can be handled as an aqueous dispersion, so that it is expected to be used as a coating-type conductive film material in place of ITO (indium-tin oxide). As mentioned above, however, PSS is a water-soluble resin, and is hardly soluble in an organic solvent. Accordingly, the polythiophene having PSS as a dopant also has a high hydrophilicity, but a low affinity to an organic solvent and an organic substrate, and thus, it is difficult to disperse it into an organic solvent or to form a film onto an organic substrate.

Besides, when the polythiophene having PSS as a dopant is used in, for example, a conductive film for an organic EL lighting, a large quantity of water tends to remain in the conductive film and the conductive film thus formed tends to absorb moisture from an outside atmosphere since the polythiophene having PSS as a dopant has an extremely high hydrophilicity as mentioned above. As a result, the problems arise that the luminous body of the organic EL chemically changes, thereby the light emitting capability is deteriorated, and that water agglomerates with the passage of time and defects are caused, which results in shortening of the lifetime of the whole organic EL device. Furthermore, there arise other problems in the polythiophene having PSS as a dopant that particles in the aqueous dispersion becomes large, the film surface becomes rough after the film formation, and a non-light emitting region, called dark spot, is caused when used for the organic EL lighting.

In addition, since the polythiophene having PSS as a dopant has an absorption at a wavelength of about 500 nm in the blue region, in the case that this material is used as a film coating a transparent substrate such as a transparent electrode, there arises another problem that when the conductivity required for the device to function is made up by the solid concentration or the thickness of the film, transmittance of the film is affected.

Furthermore, with respect to quantitative relation between the π-conjugated polymer and the dopant polymer in the polythiophene having PSS as a dopant, the molar quantity of sulfo groups in PSS exceeds the molar quantity of thiophene. Such excess sulfo group having high hydrophilicity allows the conductive composite to disperse in water. Accordingly, aqueous dispersions of a conductive polymer are strongly acidic. However, strongly acidic aqueous solutions are highly corrosive to metals, and therefore they have to be handled with caution.

In order to neutralize the strongly acidic aqueous solutions, there has been proposed methods to add a basic compound as a conductive material composition (Patent Documents 2 and 3). These documents disclose an addition of a basic compound having an amino group is exemplified.

Moreover, Patent Document 4 discloses a conductive polymer composition composed of a conductive polymer which contains a π-conjugated polymer formed of a repeating unit selected from thiophene, selenophene, tellurophene, pyrrole, aniline, and a polycyclic aromatic compound, and a fluorinated acid polymer which can be wetted by an organic solvent and 50% or more of which is neutralized by a cation. There is mentioned alkaline metals such as lithium and sodium, and amine compounds are exemplified as a cation.

In the neutralization by the foregoing cations or amine compounds, although it is possible to neutralize the aqueous solutions, the problem arises that the conductivity is lowered. Accordingly, it is desired to develop a conductive material which provides a neutral solution without lowering the conductivity.

Moreover, in the aqueous dispersion of polythiophene having PSS as a dopant, the particles are agglomerated. After the polymerization of the composite of the polythiophene having PSS as a dopant, the particles need to be pulverized by a disperser, however, the particles are getting larger with the passage of time. This is attributed to the growth of the agglomerate due to ionic bond between the particles of PSS-polythiophene composite. If the particles are getting larger, a striation occurs when the conductive solution is applied by methods such as spin coating, and a flat film cannot be obtained, which causes a dark spot when it is applied to an organic EL illumination. Accordingly, it is desired to develop a conductive solution material in which the agglomeration does not occur with the passage of time.

Moreover, the polythiophene having PSS as a dopant can also be used as a hole injection layer. In this case, the hole injection layer is provided between a transparent electrode such as ITO and a light-emitting layer. The hole injection layer does not require high conductivity since the under transparent electrode ensures the conductivity. For the hole injection layer, no occurrence of dark spot and high hole-transporting ability are required.

PRIOR ART DOCUMENTS

Patent Documents

Patent Document 1: Japanese Patent Laid-Open Publication No. 2008-146913
Patent Document 2: Japanese Patent Laid-Open Publication No. 2006-321840
Patent Document 3: Japanese Patent Laid-Open Publication No. 2014-15550
Patent Document 4: Japanese Patent No. 5264723

SUMMARY OF THE INVENTION

As mentioned above, there is a problem that the conductive polymer solution in which a composite formed from a dopant polymer having a sulfo group and a π-conjugated polymer is dispersed in water is strongly acidic, and its particles are agglomerated with the passage of time.

The present invention was made in view of the above-mentioned circumstances, and an object thereof is to provide a conductive polymer material which has low acidity, can suppress the agglomeration of the particles with the passage of time, and has excellent stability in a solution state.

To accomplish the object, the present invention provides a conductive polymer material comprising:
(A) a π-conjugated polymer,
(B) a dopant polymer which contains a repeating unit having a sulfo group and has a weight-average molecular weight in the range of 1,000 to 500,000, and
(C) an amphoteric ion compound represented by the following general formula (1),

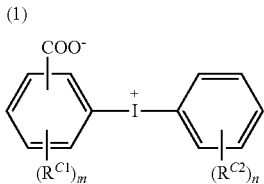

(1)

wherein $R^{C1}$ and $R^{C2}$ independently represent a linear, branched, or cyclic alkyl group having 1 to 10 carbon atoms, a linear, branched, or cyclic alkoxy group having 1 to 10 carbon atoms, an acyl group having 2 to 10 carbon atoms, an acyloxy group having 2 to 10 carbon atoms, an alkoxycarbonyl group having 2 to 10 carbon atoms, a hydroxyl group, a nitro group, a halogen atom; and "m" and "n" are each an integer of 0 to 4.

The conductive polymer material as mentioned above has low acidity, can suppress the agglomeration of the particles with the passage of time, and has excellent stability in a solution state.

The component (B) preferably contains either or both of an α-fluorinated sulfo group and a sulfo group bonded to a fluorinated aromatic group.

The polymer like this is preferred as the component (B), and by forming the composite of this dopant polymer and the π-conjugated polymer of the component (A), the material can be improved in filterability and film-formability by spin coating, and also can be improved in flatness and transparency in the visible light region after film formation.

The component (B) preferably contains one or more repeating units selected from "a1" to "a4" represented by the following general formula (2), (2)

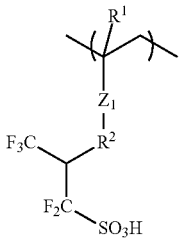  a1

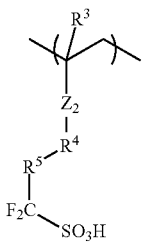  a2

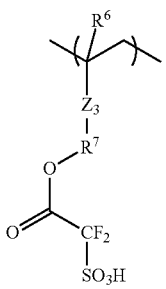  a3

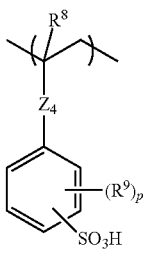  a4 wherein $R^1$, $R^3$, $R^6$, and $R^8$ independently represent a hydrogen atom or a methyl group; $R^2$, $R^4$, and $R^7$ independently represent a single bond, an ester group, or a linear, branched, or cyclic hydrocarbon group having 1 to 12 carbon atoms and optionally containing either or both of an ether group and an ester group; $R^5$ represents a linear or branched alkylene group having 1 to 4 carbon atoms in which 1 or 2 hydrogen atoms in $R^5$ may be substituted with a fluorine atom; $R^9$ represents a fluorine atom or a trifluoromethyl group; $Z_1$ and $Z_2$ independently represent a phenylene group, a naphthylene group, or an ester group; $Z_3$ represents a single bond, a phenylene group, a naphthylene group, an ether group, or an ester group; $Z_4$ represents a single bond or an ester group; when $Z_2$ represents a phenylene group, $R^4$ contains no ether group; "p" is an integer of 1 to 4; and "a1", "a2", "a3", and "a4" are each a number satisfying $0 \leq a1 \leq 1.0$, $0 \leq a2 \leq 1.0$, $0 \leq a3 \leq 1.0$, $0 \leq a4 \leq 1.0$, and $0 < a1+a2+a3+a4 \leq 1.0$.

The polymer like this is preferred as the component (B), and the material can be improved in filterability, film-formability, affinity to an organic solvent and an organic substrate, and transparency after film formation.

Also, the component (B) preferably contains a repeating unit "b" represented by the following general formula (3),

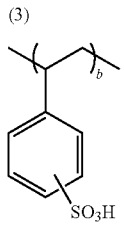

wherein "b" is a number satisfying 0<b≤1.0.

By containing the repeating unit "b", the conductivity of the material can be further enhanced.

Also, the component (B) is preferably a block copolymer.

If the component (B) is a block copolymer, the conductivity of the material can be further enhanced.

The component (A) is preferably a polymer formed by polymerization of one or more precursor monomers selected from the group consisting of pyrrole, thiophene, selenophene, tellurophene, aniline, a polycyclic aromatic compound, and a derivative thereof.

Such monomers can be readily polymerized, and have excellent stability in air; and thus, the component (A) can be readily synthesized.

The conductive polymer material preferably has dispersibility in water or in an organic solvent.

In addition, the present invention provides a substrate having a conductive film formed thereon by using the above-mentioned conductive polymer material.

Thus, the conductive polymer material of the present invention can give a conductive film by applying it onto a substrate or the like to form a film thereon.

Besides, the conductive polymer material of the present invention can be improved in its conductivity by being exposed to a light having a wavelength of 140 to 400 nm or an electron beam after it is applied onto the substrate or the like to form a film thereon.

The conductive film thus formed has excellent conductivity and transparency, so that it may function as a transparent electrode layer.

As mentioned above, in the conductive polymer material of the present invention, the dopant polymer of the component (B) which contains a strongly acidic sulfo group forms the composite together with the π-conjugated polymer of the component (A), and moreover, the amphoteric ion compound of component (C) is added, whereby acidity of solution is lowered, the agglomeration of the particles with the passage of time can be suppressed, and low corrosiveness, low viscosity, excellent stability in a solution state, good filterability, and superior film-formability by spin coating are provided. In addition, when a film is formed from the inventive material, a conductive film excellent in transparency, flatness, smoothness, and conductivity as well as durability can be formed. Moreover, the conductivity can be improved by irradiation with a light after the film formation. Further, the above-mentioned conductive polymer material has excellent film-formability onto both an organic substrate and an inorganic substrate.

In addition, the conductive film formed by the above-mentioned conductive polymer material has excellent conductivity, transparency, and the like, so that this film may function as a transparent electrode layer.

DETAILED DESCRIPTION OF THE PREFERRED EMBODIMENTS

As mentioned above, it has been desired to develop a conductive film-forming material which has low acidity, can suppress the agglomeration of the particles with the passage of time, and has excellent stability in a solution state.

The present inventors has diligently studied to accomplish the above-mentioned objects and consequently found the following. When polystyrene sulfonic acid (PSS), which has been widely used as a dopant of a conductive polymer material, or a polymer having a repeating unit that contains an α-fluorinated sulfo group or a sulfo group bonded to a fluorinated aromatic group is used as a dopant polymer, the strongly acidic dopant polymer strongly interacts with the π-conjugated polymer, and thereby the conductive material expresses a conductivity; by addition of an iodonium salt having a carboxyl group to this conductive material, the strongly acidic sulfo group is neutralized and thereby the corrosiveness is lowered, the agglomeration of the conductive polymer composite is suppressed and thereby excellent film-smoothness after film formation can be maintained with the passage of time, and the iodonium salt is decomposed by irradiating with a light after the film formation and thereby the conductivity is improved. From the above finding, they brought the present invention to completion.

Hereinafter, the present invention will be described in detail, but the present invention is not limited thereto.

[(A) π-Conjugated Polymer]

The conductive polymer material of the present invention contains a π-conjugated polymer as component (A). The component (A) may be a polymer obtained by polymerization of a precursor monomer (i.e. organic monomer molecule) to form a π-conjugated chain which is a structure having a single bond and a double bond alternately and successively.

Illustrative examples of the precursor monomer include monocyclic aromatic compounds such as pyrroles, thiophenes, thiophene vinylenes, selenophenes, tellurophenes, phenylenes, phenylene vinylenes, and anilines; polycyclic aromatic compounds such as acenes; and acetylenes; and a homopolymer or a copolymer of these monomers can be used as the component (A).

Among these monomers, in view of easiness in polymerization and stability in air, pyrrole, thiophene, selenophene, tellurophene, aniline, a polycyclic aromatic compound, and a derivative thereof are preferable. Particularly preferable are pyrrole, thiophene, aniline, and a derivative thereof, though not limited thereto.

If the conductive polymer material of the present invention particularly contains polythiophene as the component (A), it is expected to be developed into the application to touch panel, organic EL display, organic EL lighting, etc., because of its high conductivity and high transparency in the visible light. On the other hand, if the conductive polymer material of the present invention contains polyaniline as the component (A), it is difficultly applied to display and so on since its absorption in the visible light is larger and the conductivity thereof is lower compared with the case of containing polythiophene, but it can be considered to use it for a condenser or a top coat of the resist upper layer film to prevent electric charge in the EB lithography since it can be readily spin-coated because of low viscosity.

The component (A) may attain a sufficient conductivity even if the monomers which will constitute the π-conjugated polymer is not substituted; however, in order to further enhance the conductivity, monomers substituted with an alkyl group, a carboxyl group, a sulfo group, an alkoxy group, a hydroxyl group, a cyano group, a halogen atom, or the like may also be used.

Illustrative examples of the monomers of pyrroles, thiophenes, and anilines include pyrrole, N-methyl pyrrole, 3-methyl pyrrole, 3-ethyl pyrrole, 3-n-propyl pyrrole, 3-butyl pyrrole, 3-octyl pyrrole, 3-decyl pyrrole, 3-dodecyl pyrrole, 3,4-dimethyl pyrrole, 3,4-dibutyl pyrrole, 3-carboxy pyrrole, 3-methyl-4-carboxy pyrrole, 3-methyl-4-carboxyethyl pyrrole, 3-methyl-4-carboxybutyl pyrrole, 3-hydroxy pyrrole, 3-methoxy pyrrole, 3-ethoxy pyrrole, 3-butoxy pyrrole, 3-hexyloxy pyrrole, and 3-methyl-4-hexyloxy pyrrole; thiophene, 3-methyl thiophene, 3-ethyl thiophene, 3-propyl thiophene, 3-butyl thiophene, 3-hexyl thiophene, 3-heptyl thiophene, 3-octyl thiophene, 3-decyl thiophene, 3-dodecyl thiophene, 3-octadecyl thiophene, 3-bromo thiophene, 3-chloro thiophene, 3-iodo thiophene, 3-cyano thiophene, 3-phenyl thiophene, 3,4-dimethyl thiophene, 3,4-dibutyl thiophene, 3-hydroxy thiophene, 3-methoxy thiophene, 3-ethoxy thiophene, 3-butoxy thiophene, 3-hexyloxy thiophene, 3-heptyloxy thiophene, 3-octyloxy thiophene, 3-decyloxy thiophene, 3-dodecyloxy thiophene, 3-octadecyloxy thiophene, 3,4-dihydroxy thiophene, 3,4-dimethoxy thiophene, 3,4-diethoxy thiophene, 3,4-dipropoxy thiophene, 3,4-dibutoxy thiophene, 3,4-dihexyloxy thiophene, 3,4-diheptyloxy thiophene, 3,4-dioctyloxy thiophene, 3,4-didecyloxy thiophene, 3,4-didodecyloxy thiophene, 3,4-ethylenedioxy thiophene, 3,4-ethylenedithio thiophene, 3,4-propylenedioxy thiophene, 3,4-butenedioxy thiophene, 3-methyl-4-methoxy thiophene, 3-methyl-4-ethoxy thiophene, 3-carboxy thiophene, 3-methyl-4-carboxy thiophene, 3-methyl-4-carboxymethyl thiophene, 3-methyl-4-carboxyethyl thiophene, 3-methyl-4-carboxybutyl thiophene, 3,4-(2,2-dimethylpropylenedioxy)thiophene, 3,4-(2,2-diethylpropylenedioxy)thiophene, (2,3-dihydrothieno[3,4-b][1,4]dioxin-2-yl)methanol; aniline, 2-methyl aniline, 3-methyl aniline, 2-ethyl aniline, 3-ethyl aniline, 2-propyl aniline, 3-propyl aniline, 2-butyl aniline, 3-butyl aniline, 2-isobutyl aniline, 3-isobutyl aniline, 2-methoxy aniline, 2-ethoxy aniline, 2-aniline sulfonic acid, and 3-aniline sulfonic acid.

Among them, a (co)polymer consisting of one or two compounds selected from pyrrole, thiophene, N-methyl pyrrole, 3-methyl thiophene, 3-methoxy thiophene, and 3,4-ethylenedioxy thiophene is preferably used in view of resistance value and reactivity. Moreover, a homopolymer consisting of pyrrole or 3,4-ethylenedioxy thiophene has high conductivity; and therefore it is more preferable.

Meanwhile, for a practical reason, the repeat number of these repeating units (i.e. precursor monomers) in the component (A) is preferably in the range of 2 to 20, more preferably 6 to 15.

In addition, the molecular weight of the component (A) is preferably about 130 to about 5,000.

[(B) Dopant Polymer]

The conductive polymer material of the present invention contains a dopant polymer as component (B). The dopant polymer of the component (B) contains a repeating unit having a sulfo group, preferably either or both of an α-fluorinated sulfo group and a sulfo group bonded to a fluorinated aromatic group. In particular, the component (B) is preferably a superacidic polymer containing one or more repeating units selected from "a1" to "a4" represented by the following general formula (2),

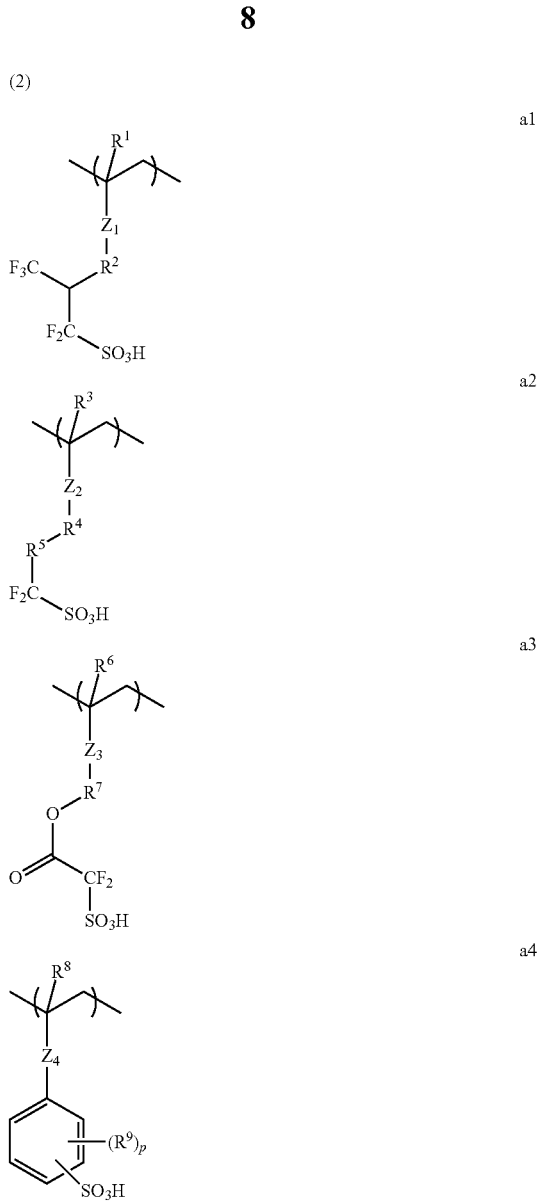

wherein $R^1$, $R^3$, $R^6$, and $R^8$ independently represent a hydrogen atom or a methyl group; $R^2$, $R^4$, and $R^7$ independently represent a single bond, an ester group, or a linear, branched, or cyclic hydrocarbon group having 1 to 12 carbon atoms and optionally containing either or both of an ether group and an ester group; $R^5$ represents a linear or branched alkylene group having 1 to 4 carbon atoms in which 1 or 2 hydrogen atoms in $R^5$ may be substituted with a fluorine atom; $R^9$ represents a fluorine atom or a trifluoromethyl group; $Z_1$ and $Z_2$ independently represent a phenylene group, a naphthylene group, or an ester group; $Z_3$ represents a single bond, a phenylene group, a naphthylene group, an ether group, or an ester group; $Z_4$ represents a single bond or an ester group; when $Z_2$ represents a phenylene group, $R^4$ contains no ether group; "p" is an integer of 1 to 4; and "a1", "a2", "a3", and "a4" are each a number satisfying $0 \leq a1 \leq 1.0$, $0 \leq a2 \leq 1.0$, $0 \leq a3 \leq 1.0$, $0 \leq a4 \leq 1.0$, and $0 < a1+a2+a3+a4 \leq 1.0$.

Illustrative examples of the monomer to give the repeating unit "a1" include the following compounds.

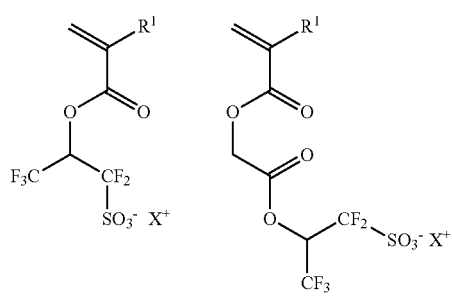
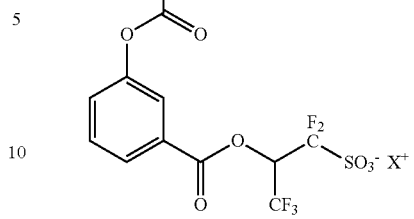
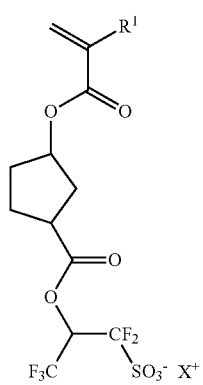
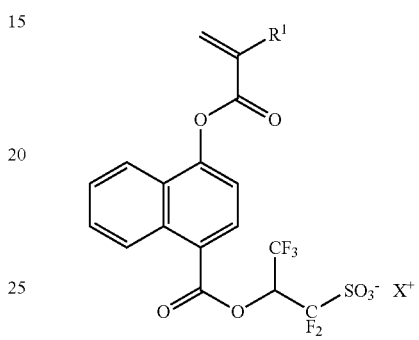
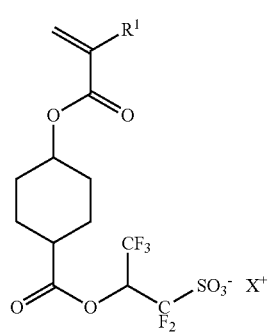
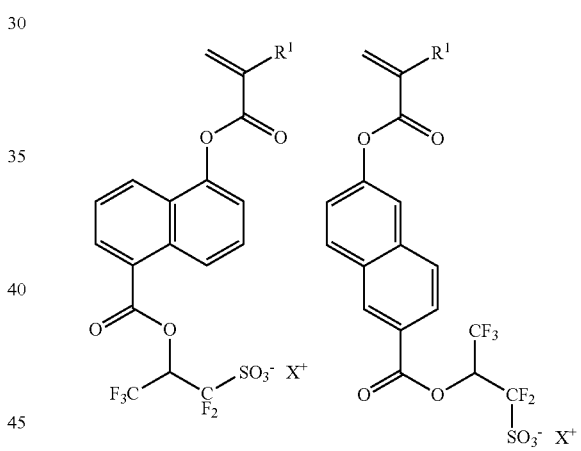
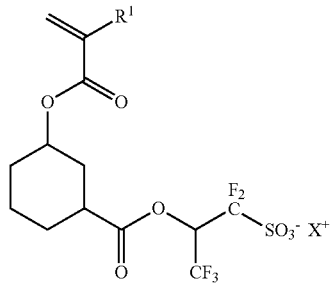
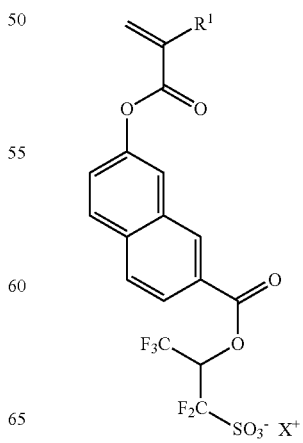
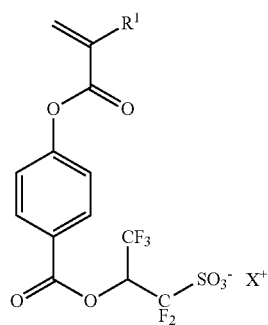

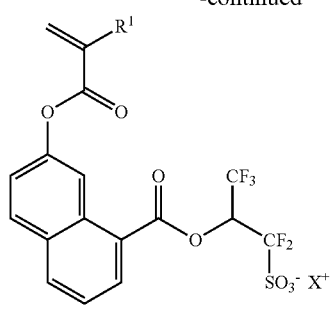
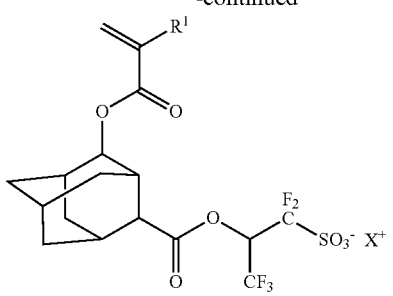
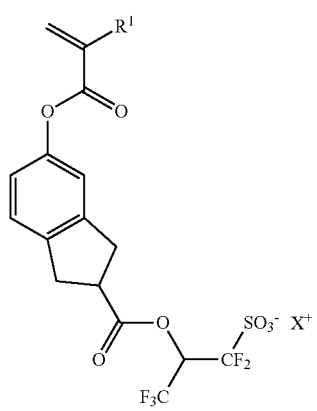
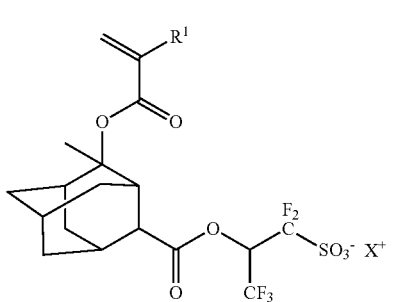
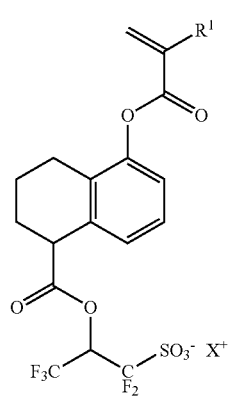
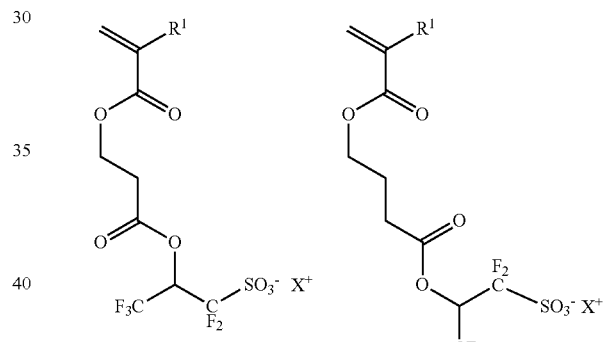
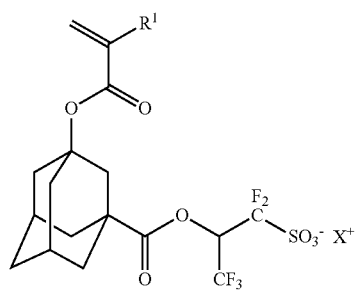
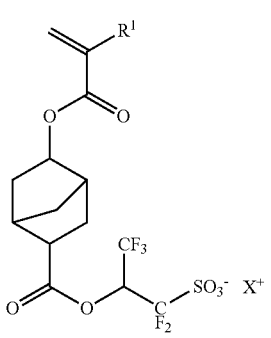
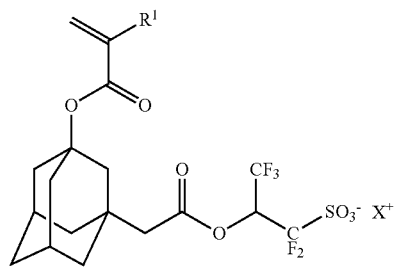
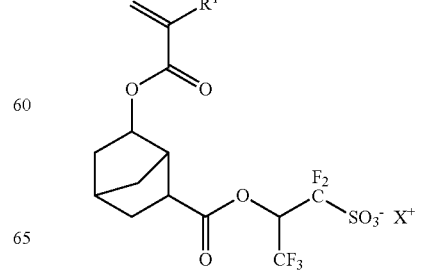

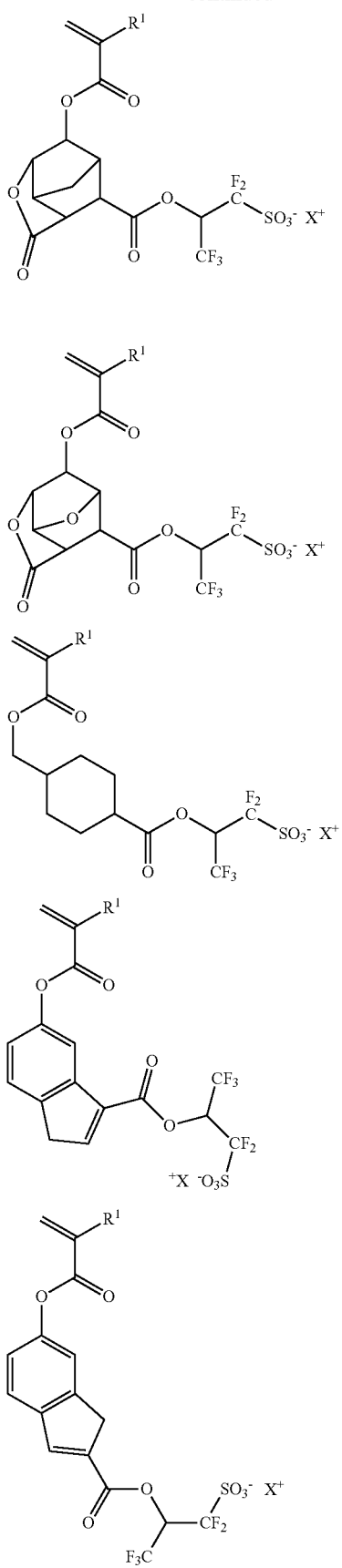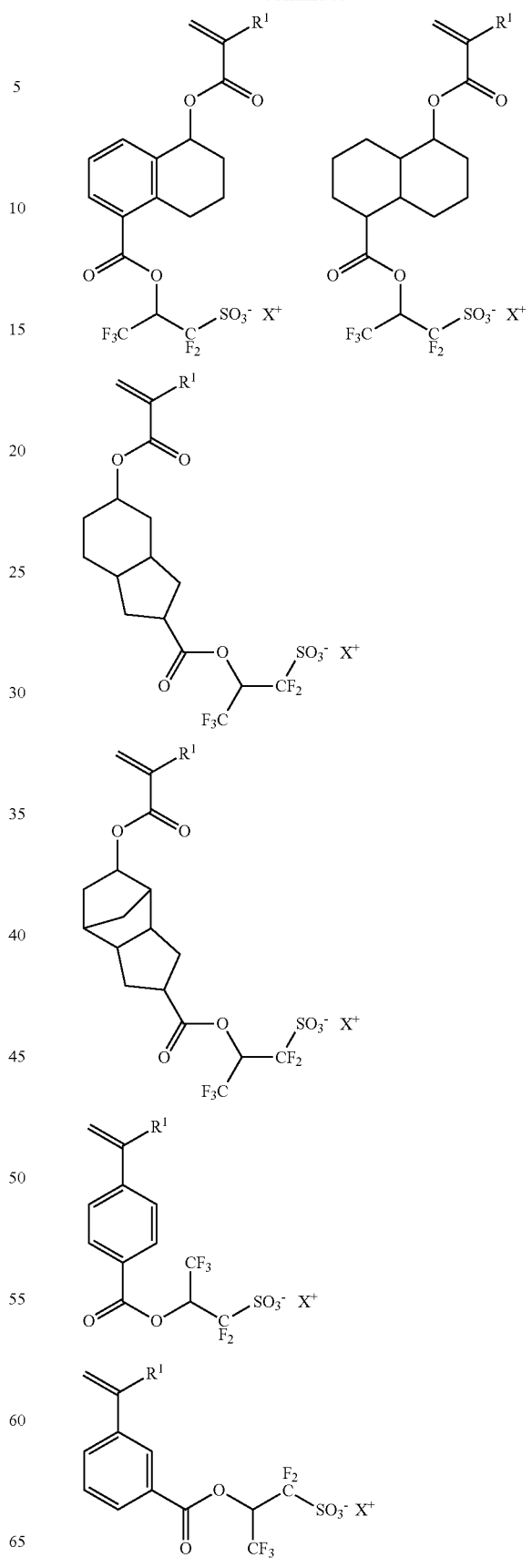

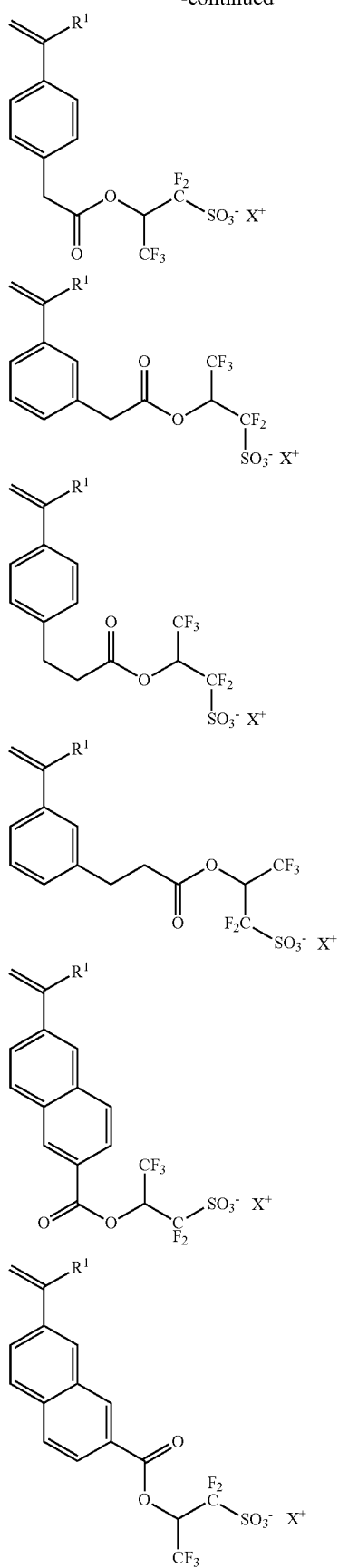
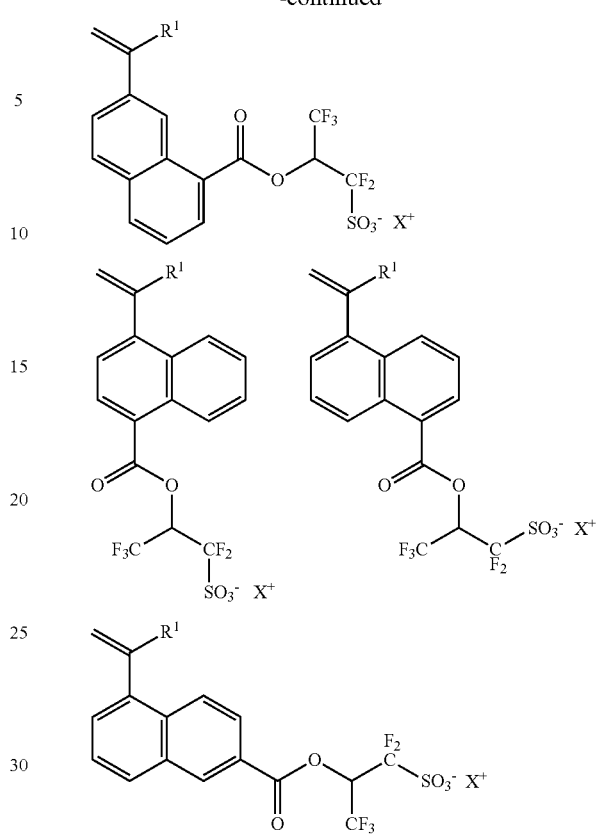
wherein R¹ has the same meaning as defined above; and X represents a hydrogen atom, a lithium atom, a sodium atom, a potassium atom, an amine compound, or a sulfonium compound.
Illustrative examples of the monomer to give the repeating unit "a2" include the following compounds.
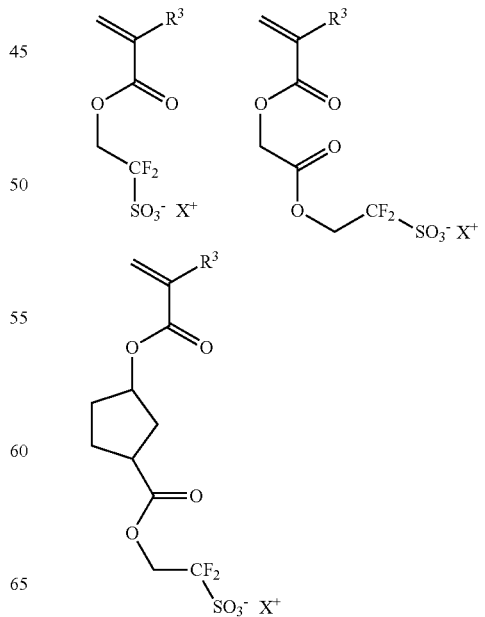

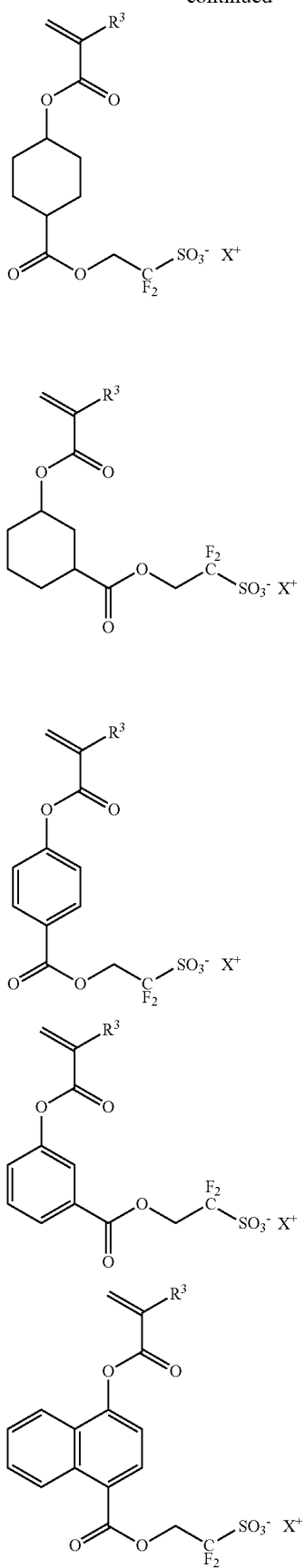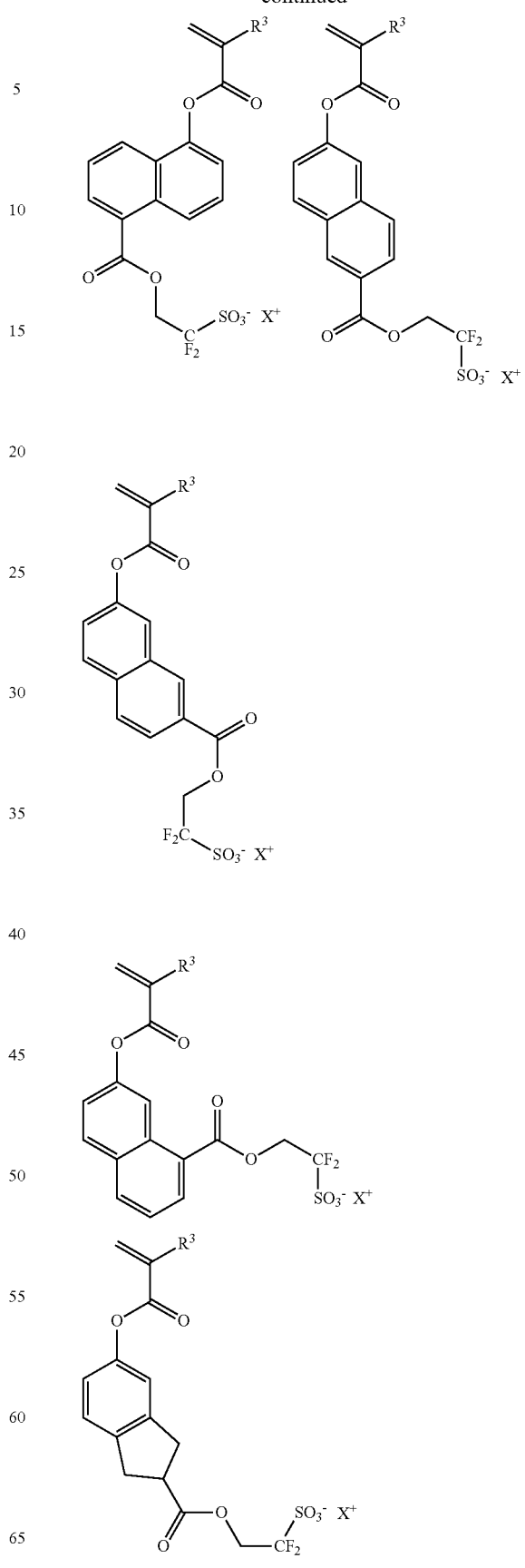

-continued
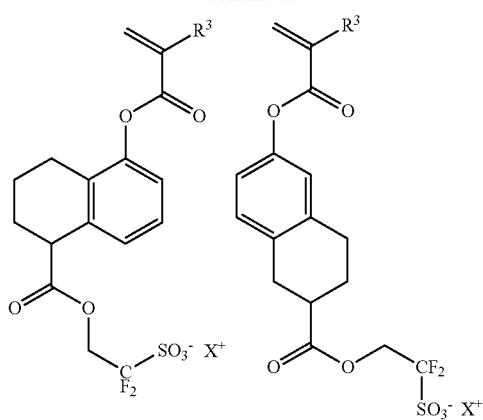
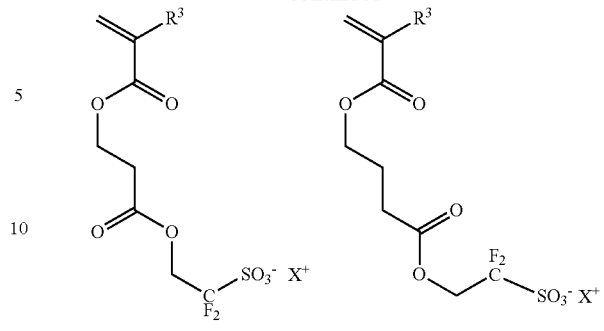
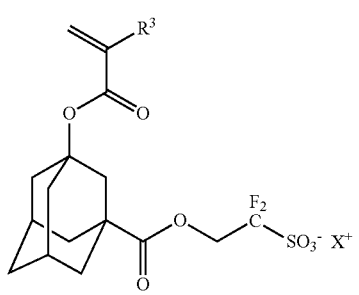
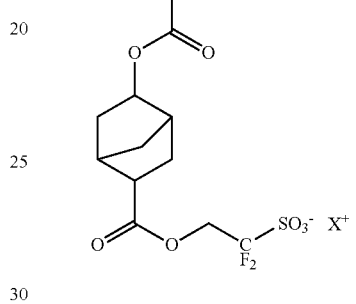
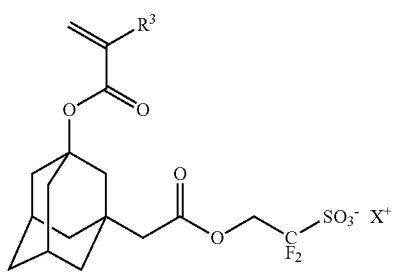
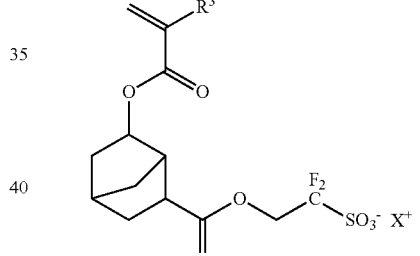
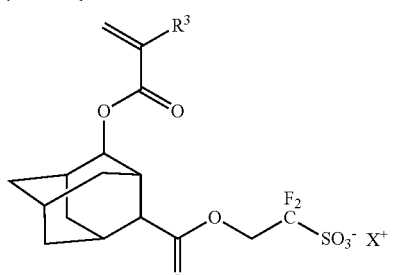
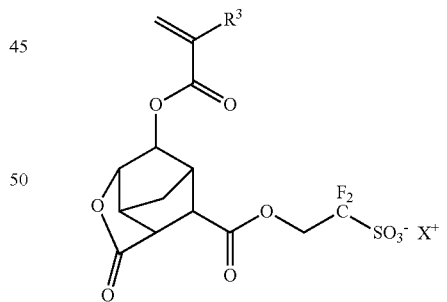
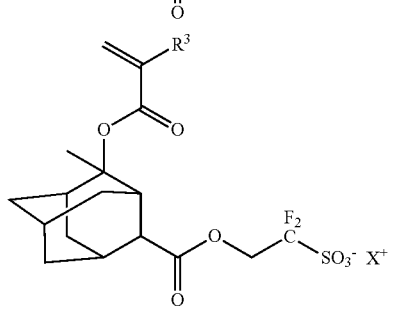
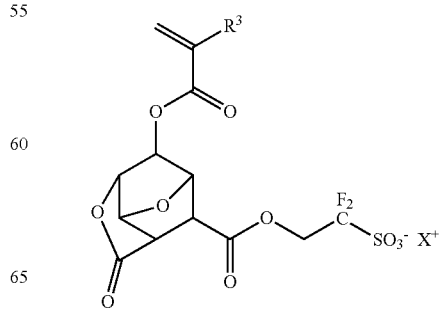

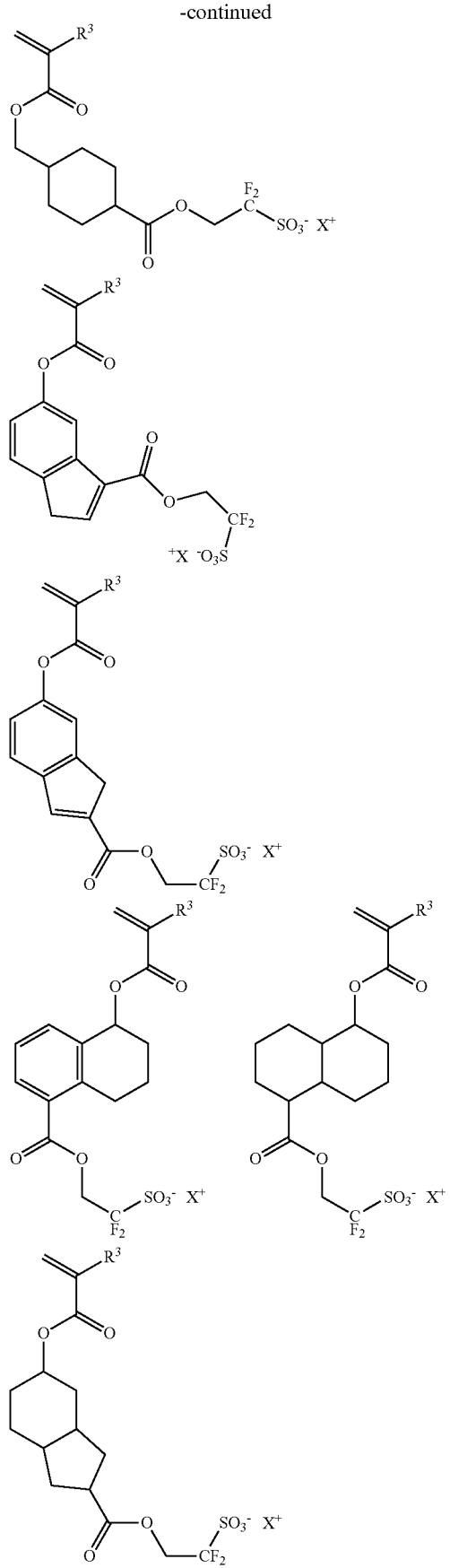
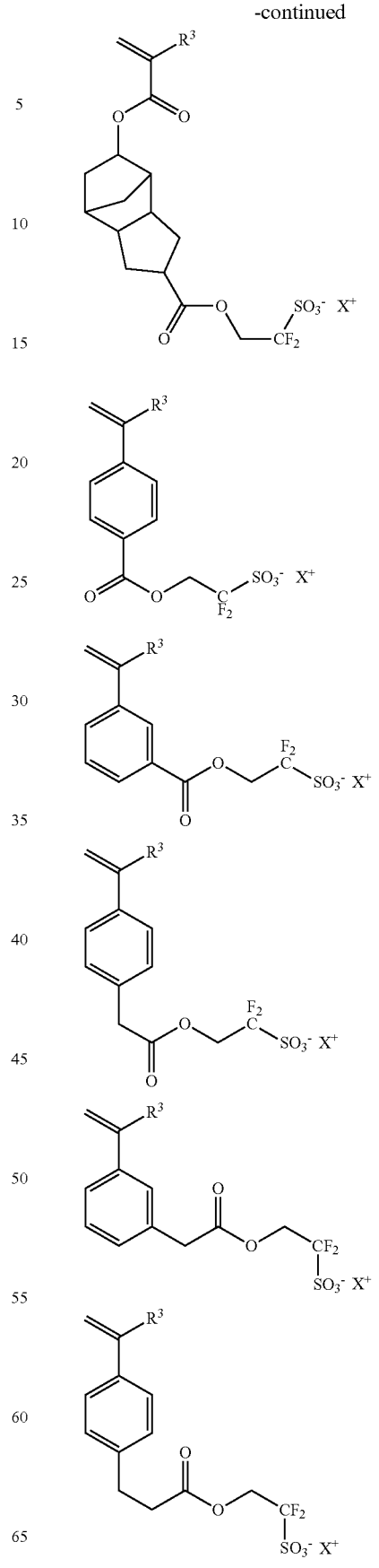

-continued
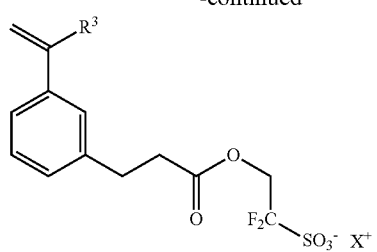
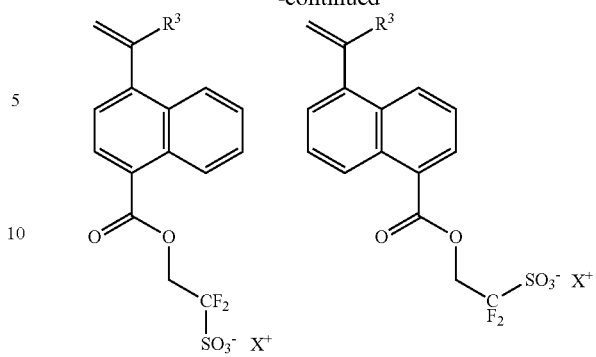
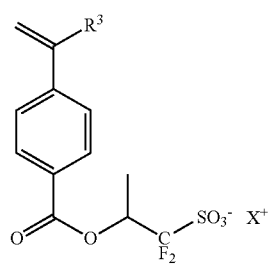
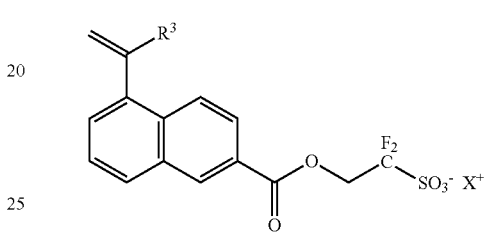
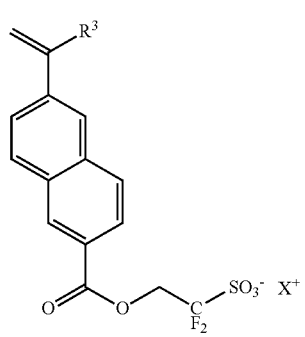
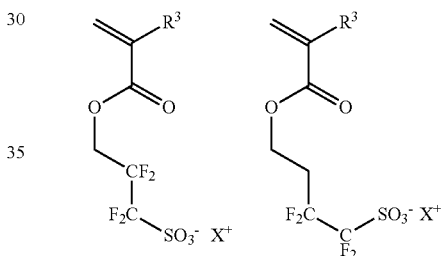
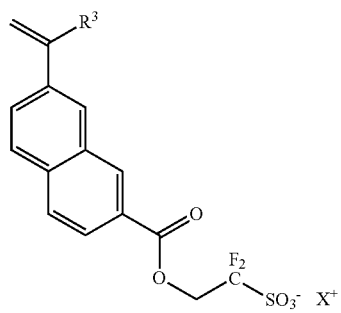
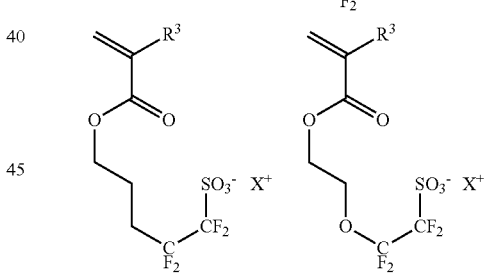
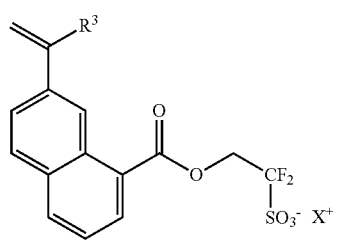
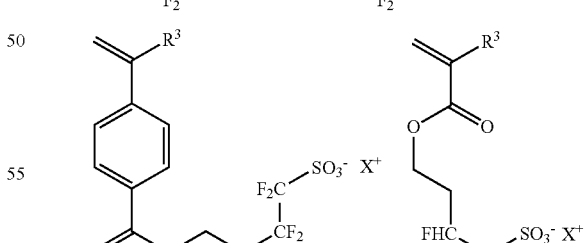
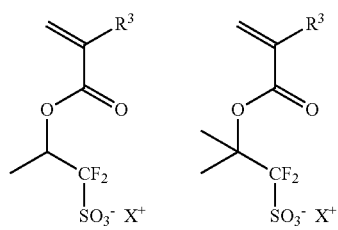
wherein $R^3$ has the same meaning as defined above; and X represents a hydrogen atom, a lithium atom, a sodium atom, a potassium atom, an amine compound, or a sulfonium compound.
Illustrative examples of the monomer to give the repeating unit "a3" include the following compounds.

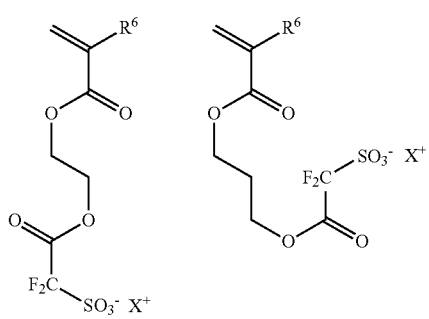
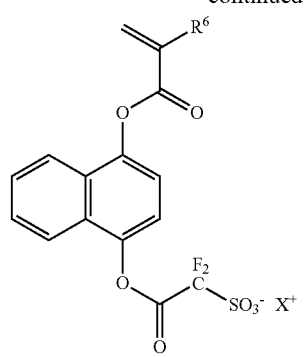
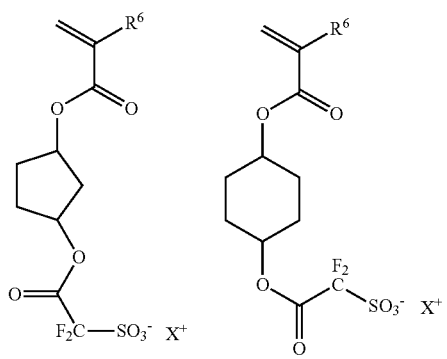
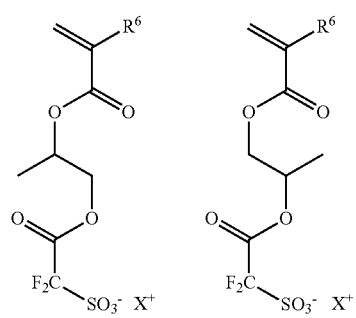
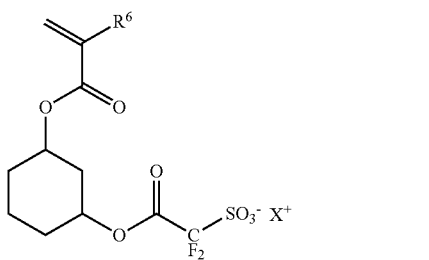
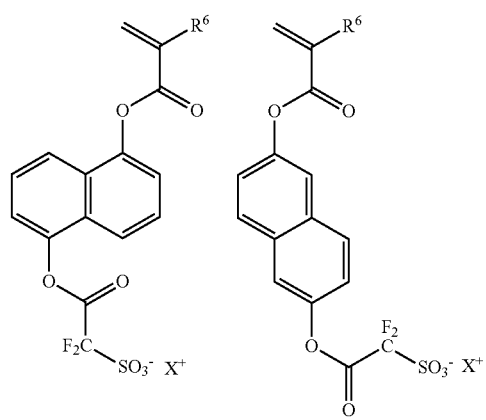
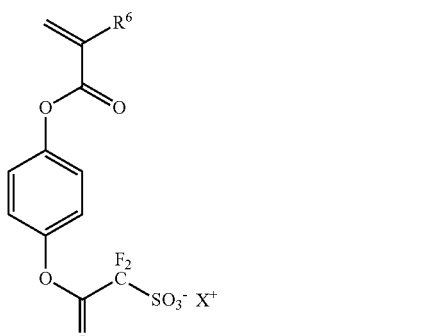
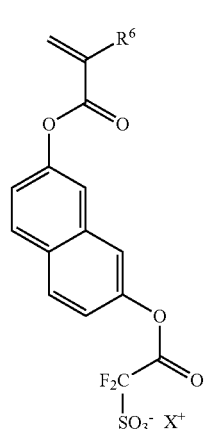
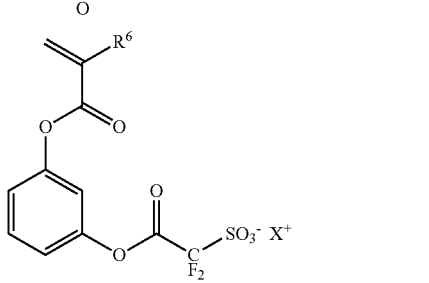

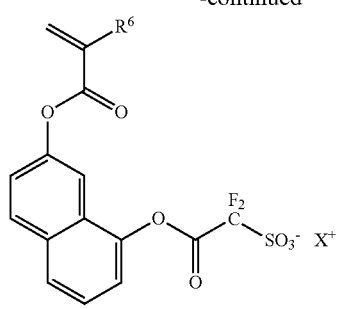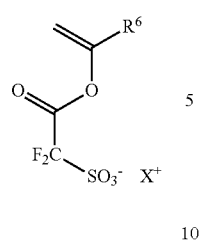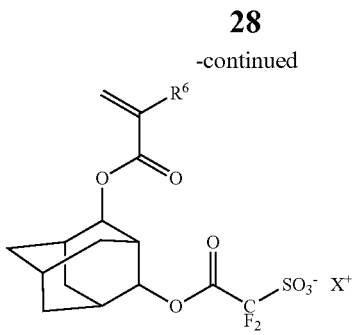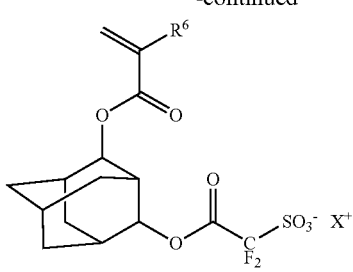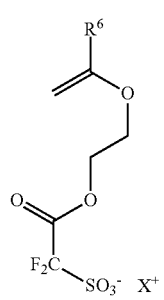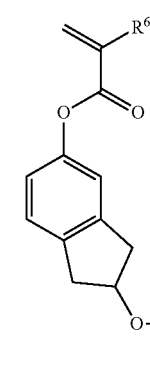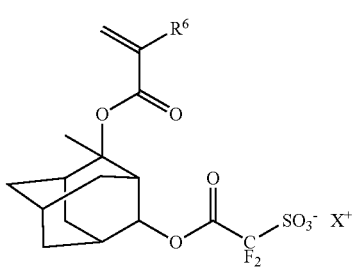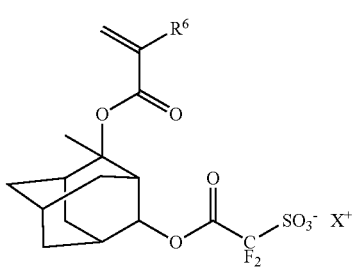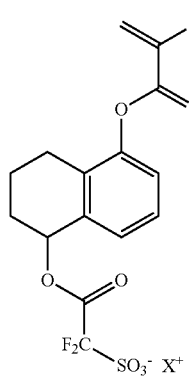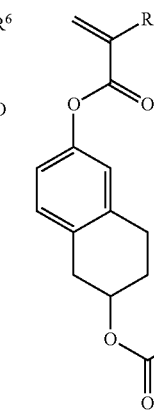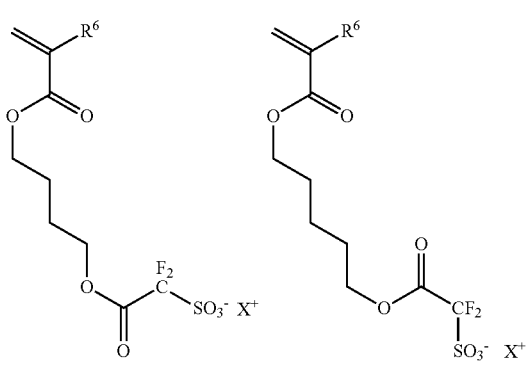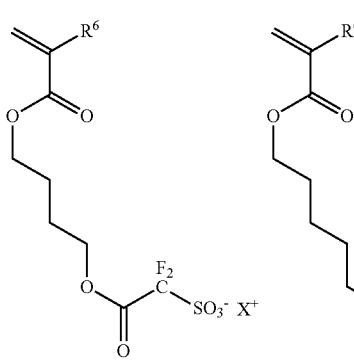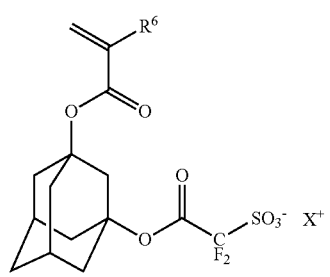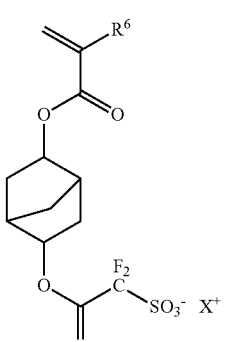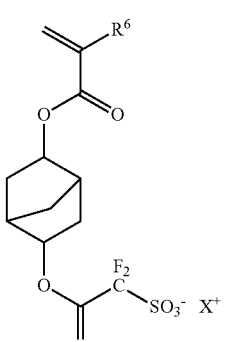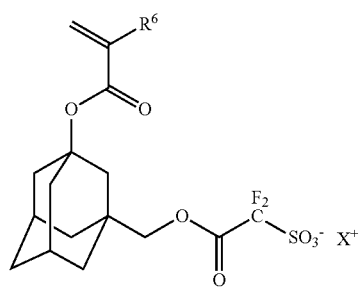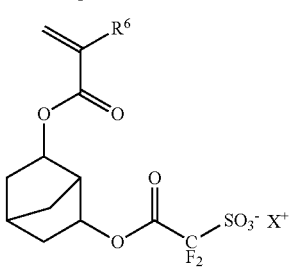

-continued
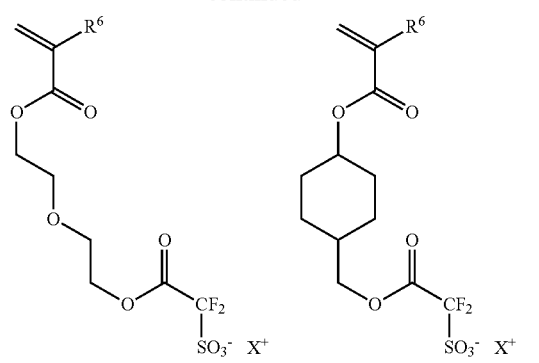
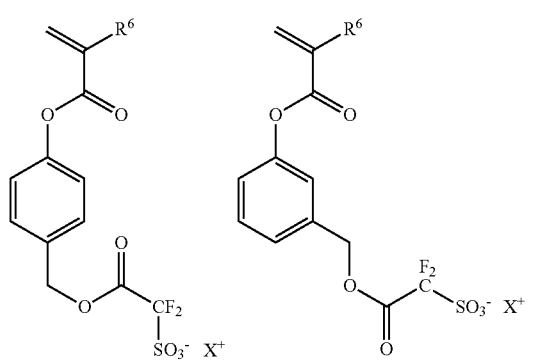
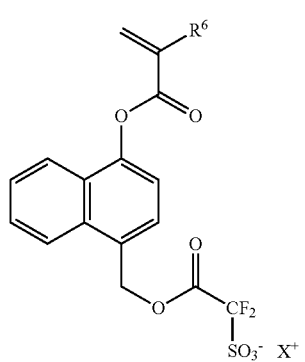
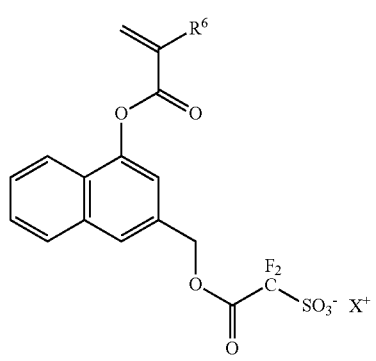
-continued
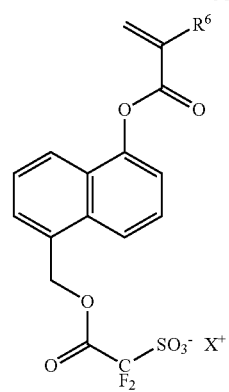
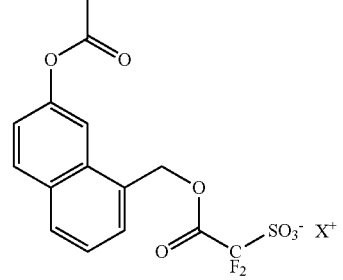
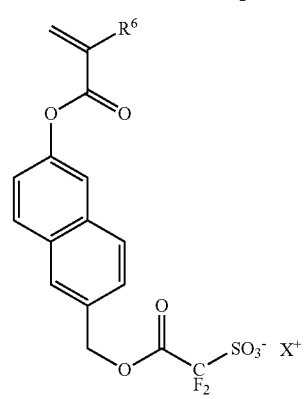
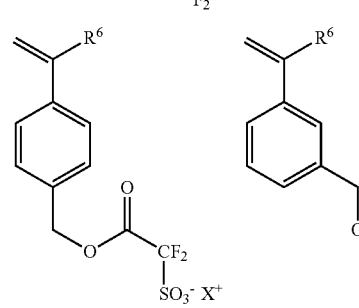
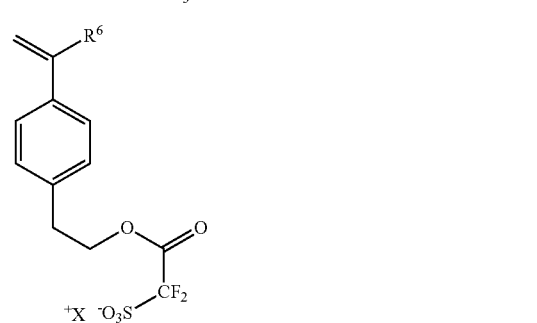

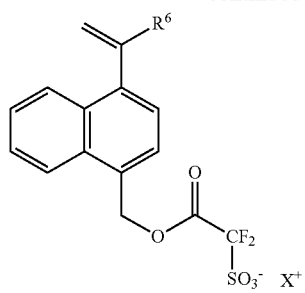
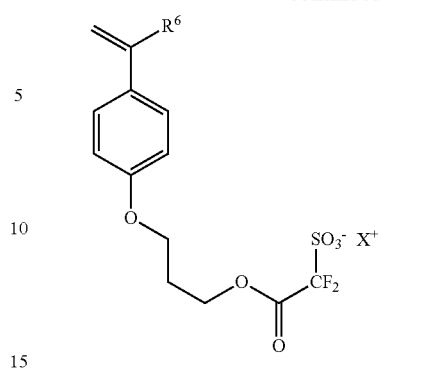
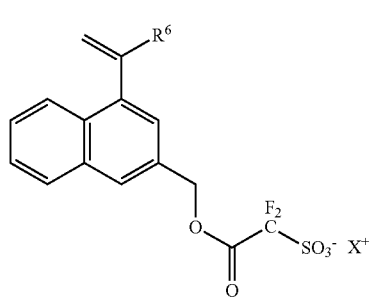
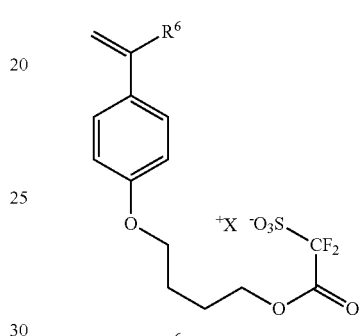
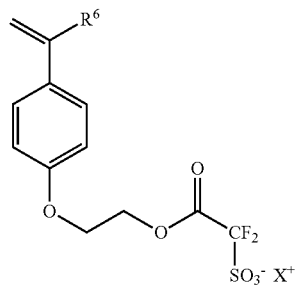
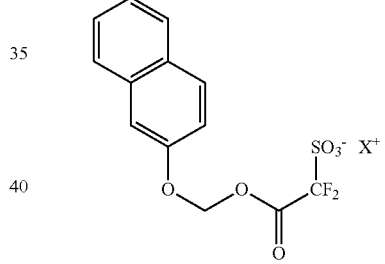
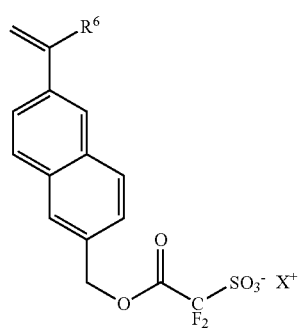
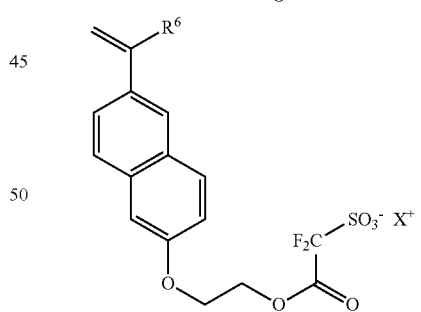
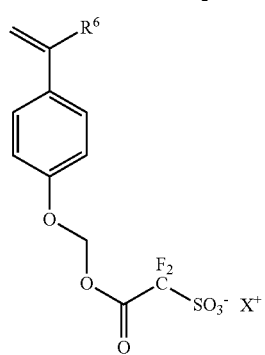
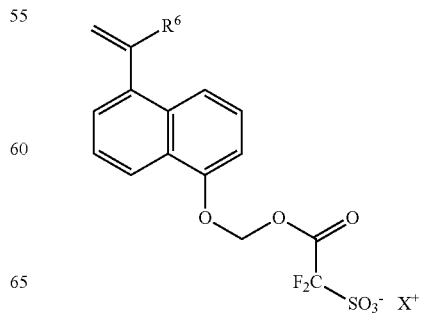

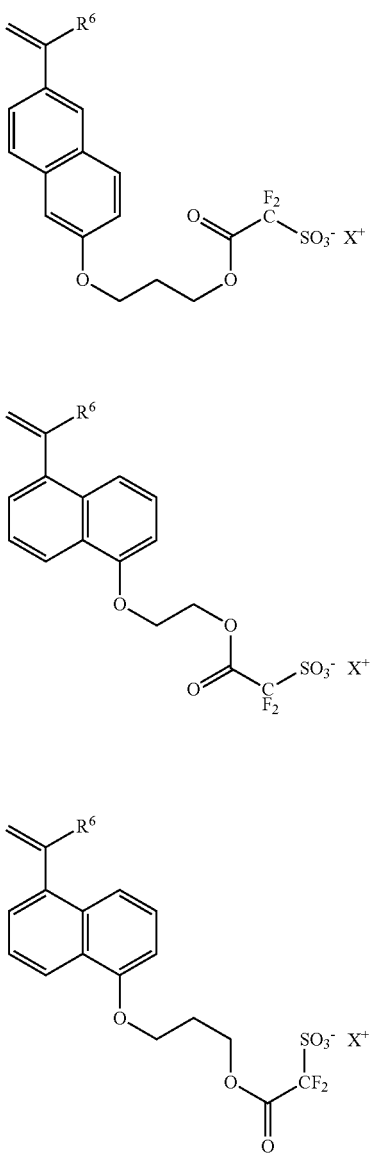

wherein R⁶ has the same meaning as defined above; and X represents a hydrogen atom, a lithium atom, a sodium atom, a potassium atom, an amine compound, or a sulfonium compound.

Illustrative examples of the monomer to give the repeating unit "a4" include the following compounds.

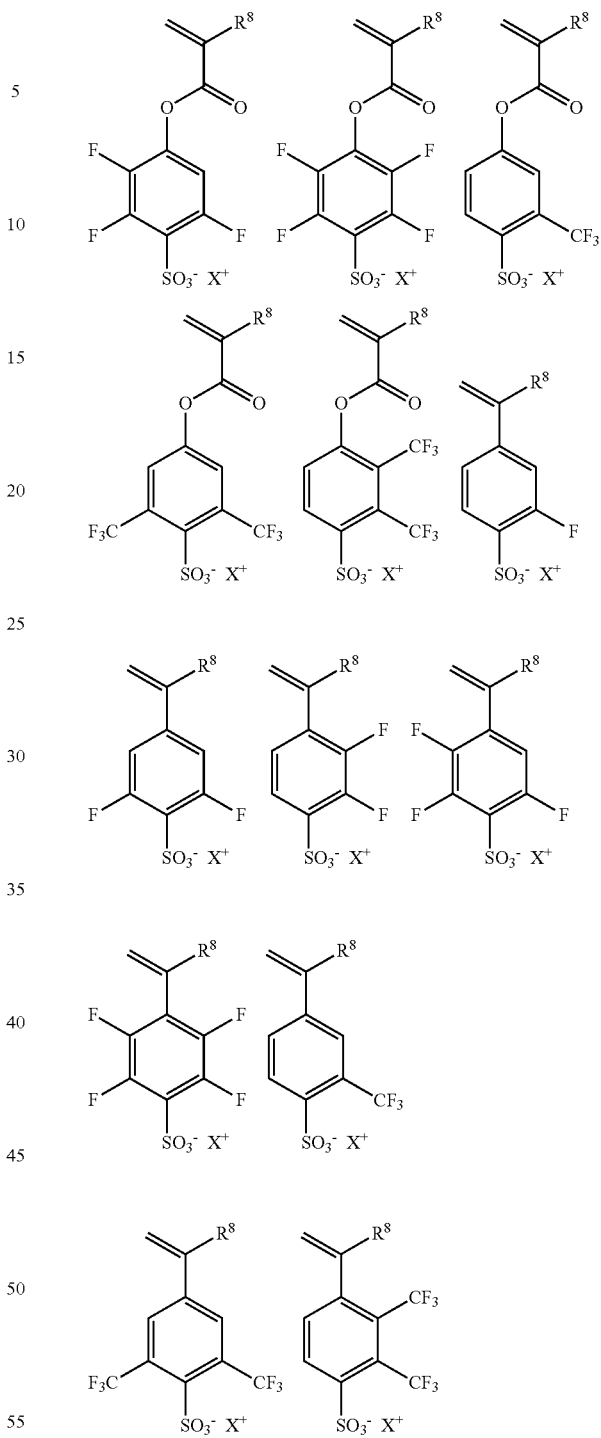

wherein $R^8$ has the same meaning as defined above; and X represents a hydrogen atom, a lithium atom, a sodium atom, a potassium atom, an amine compound, or a sulfonium compound.

The component (B) preferably contains a repeating unit "b" represented by the following general formula (3). By containing the repeating unit "b", the conductivity can be further enhanced.

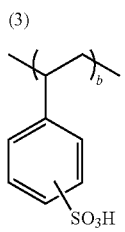

(3)

wherein "b" is a number satisfying 0<b≤1.0.

Illustrative examples of the monomer to give the repeating unit "b" include the following compounds,

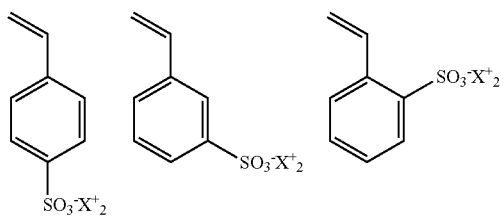

wherein $X_2$ represents a hydrogen atom, a lithium atom, a sodium atom, a potassium atom, an amine compound, or a sulfonium compound.

If X and/or $X_2$ are amine compounds, (P1a-3) described in paragraph (0048) of Japanese Patent Laid-Open Publication No. 2013-228447 may be mentioned as examples.

Here, as mentioned before, it is preferred that "a1", "a2", "a3", and "a4" be each a number satisfying 0≤a1≤1.0, 0≤a2≤1.0, 0≤a3≤1.0, 0≤a4≤1.0, and 0<a1+a2+a3+a4≤1.0; more preferably 0.2≤a1≤1.0, 0.2≤a2≤1.0, 0.2≤a3≤1.0, 0.2≤a4≤1.0, and 0.2≤a1+a2+a3+a4≤1.0. If the repeating unit "b" is contained, in view of enhancing the conductivity, "b" is preferably in the range of 0.2≤b≤1.0, more preferably 0.3≤b≤1.0.

In addition, the dopant polymer of the component (B) may contain a repeating unit "c" besides the repeating units "a1" to "a4" and the repeating unit "b"; and examples of the repeating unit "c" include a styrene type, a vinylnaphthalene type, a vinylsilane type, acenaphthylene, indene, and vinylcarbazole.

Illustrative examples of the monomer to give the repeating unit "c" include the following compound,

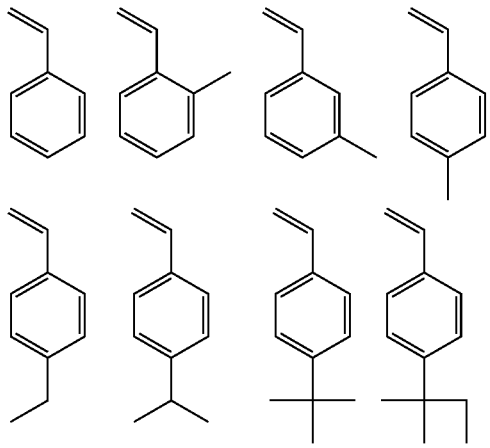

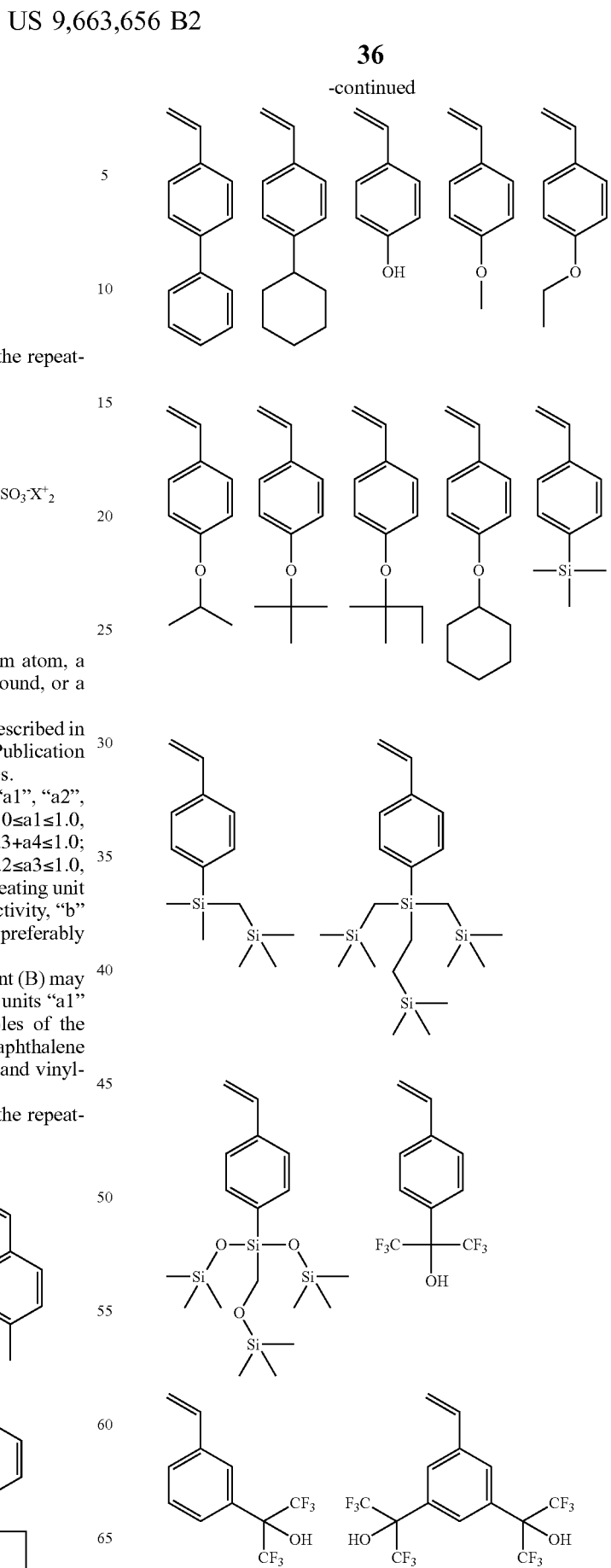

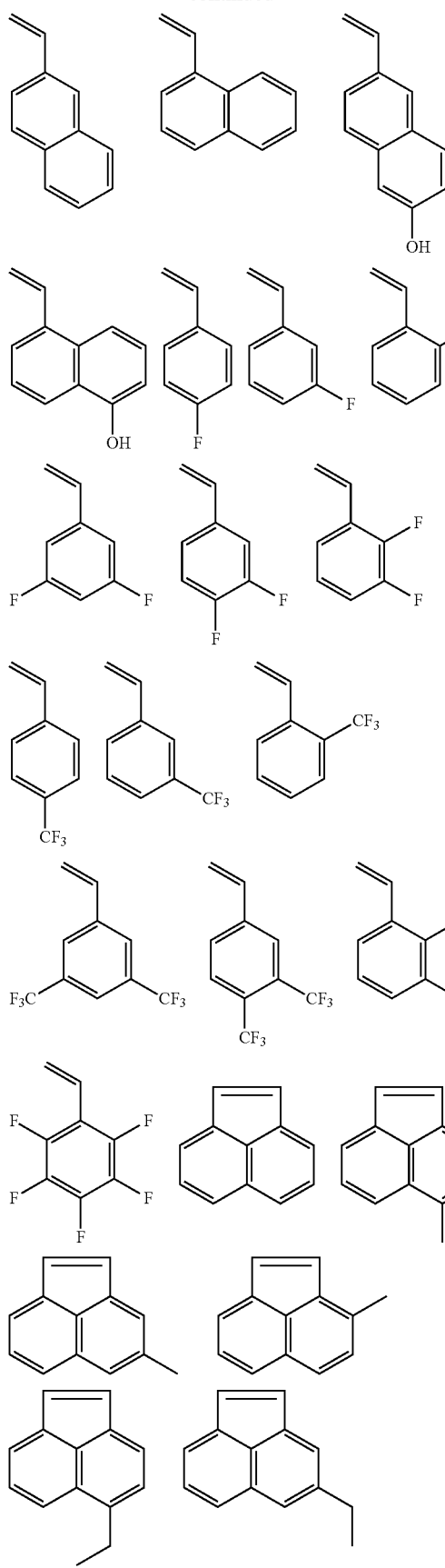
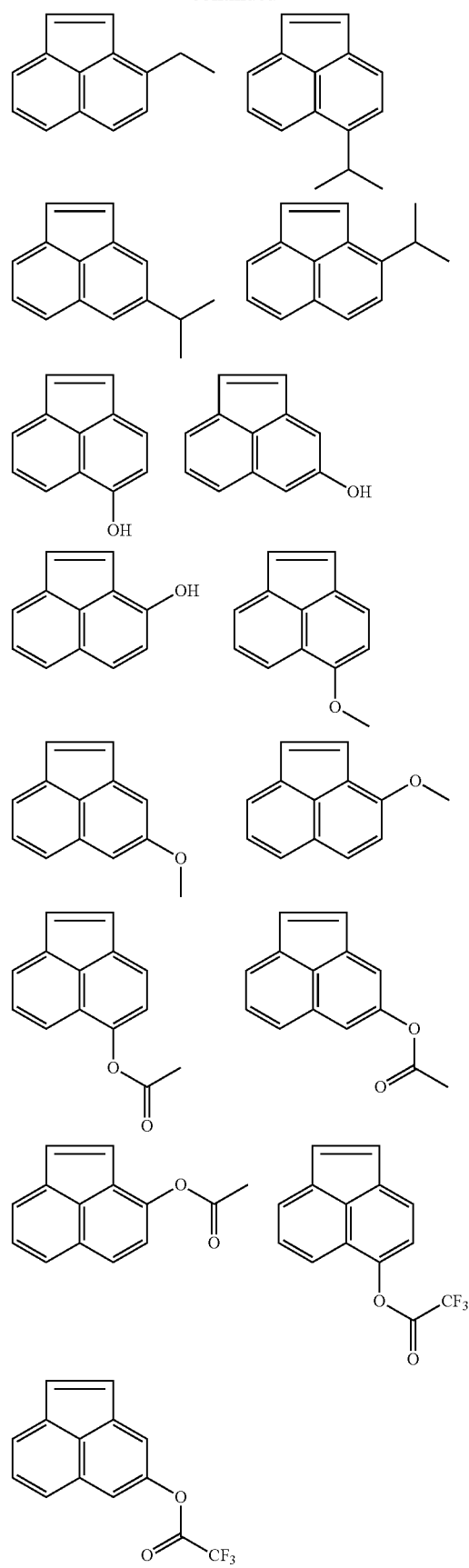

-continued
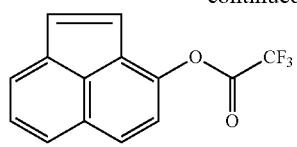
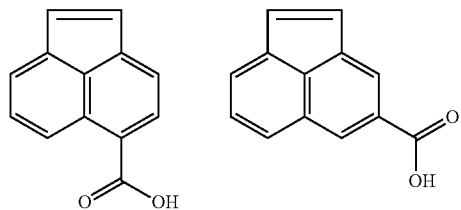
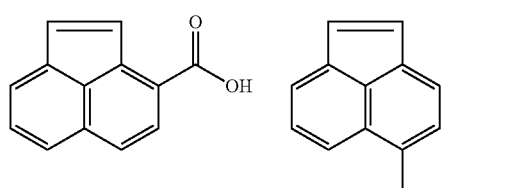
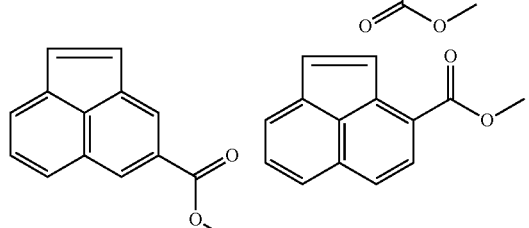
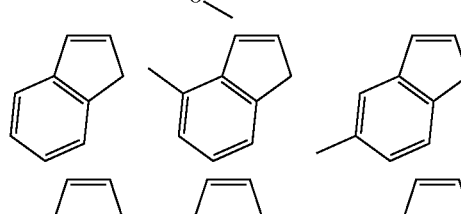
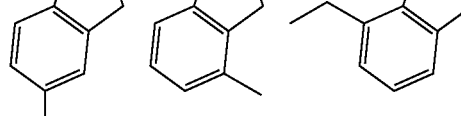
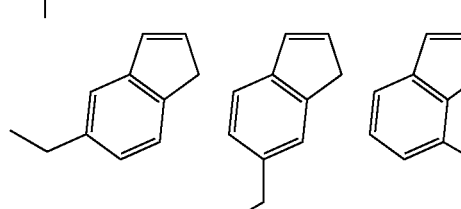
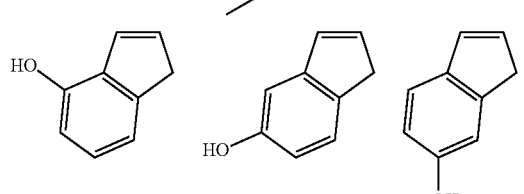
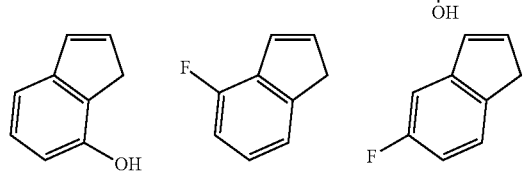
-continued
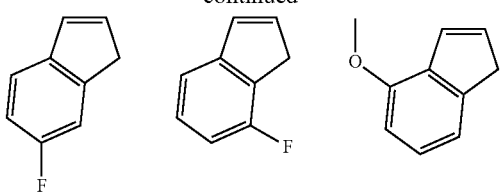
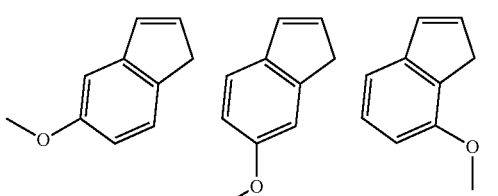
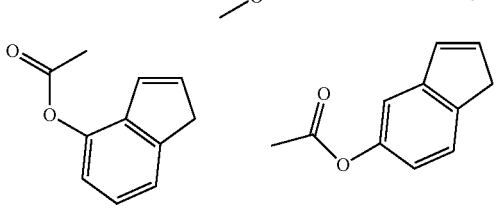
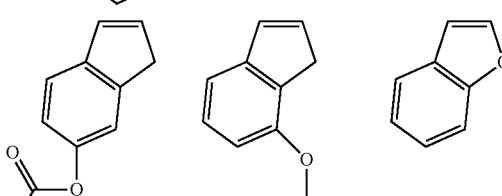
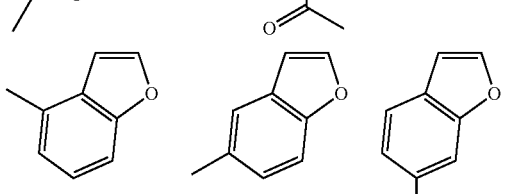
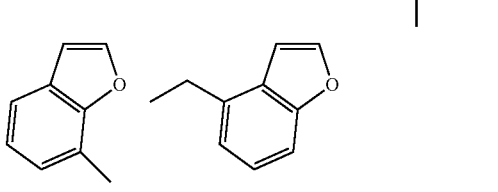
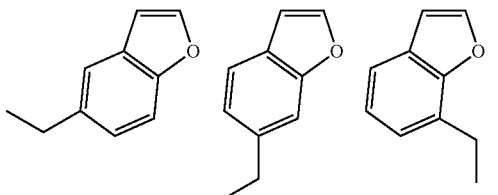
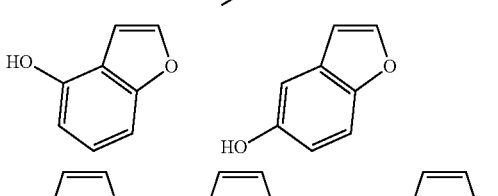
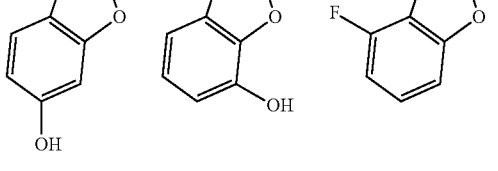

-continued

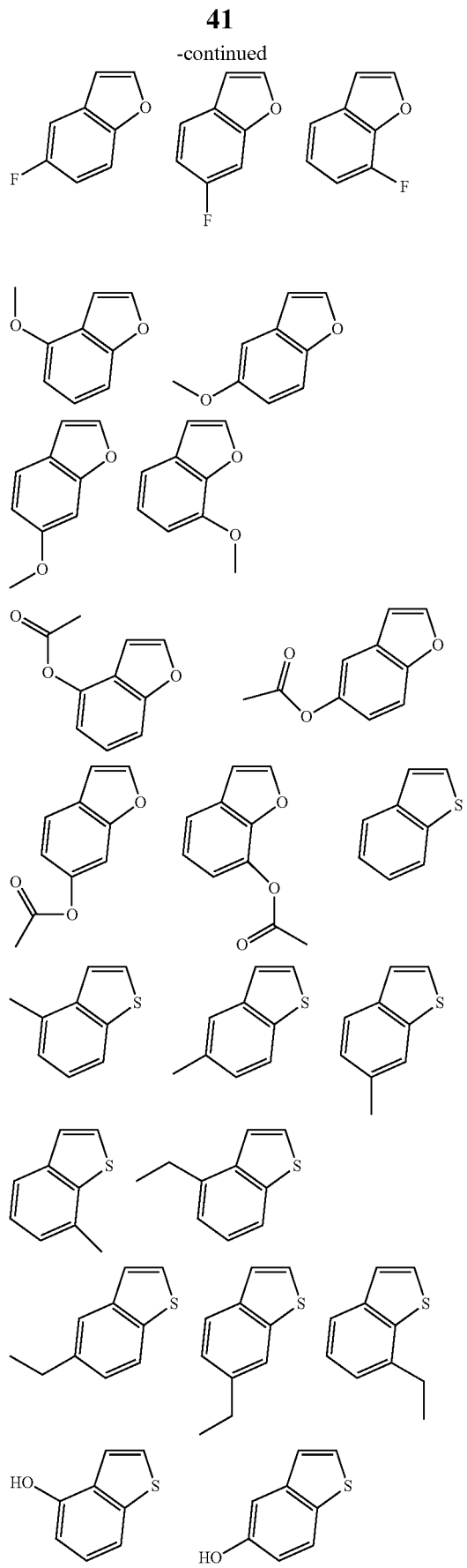

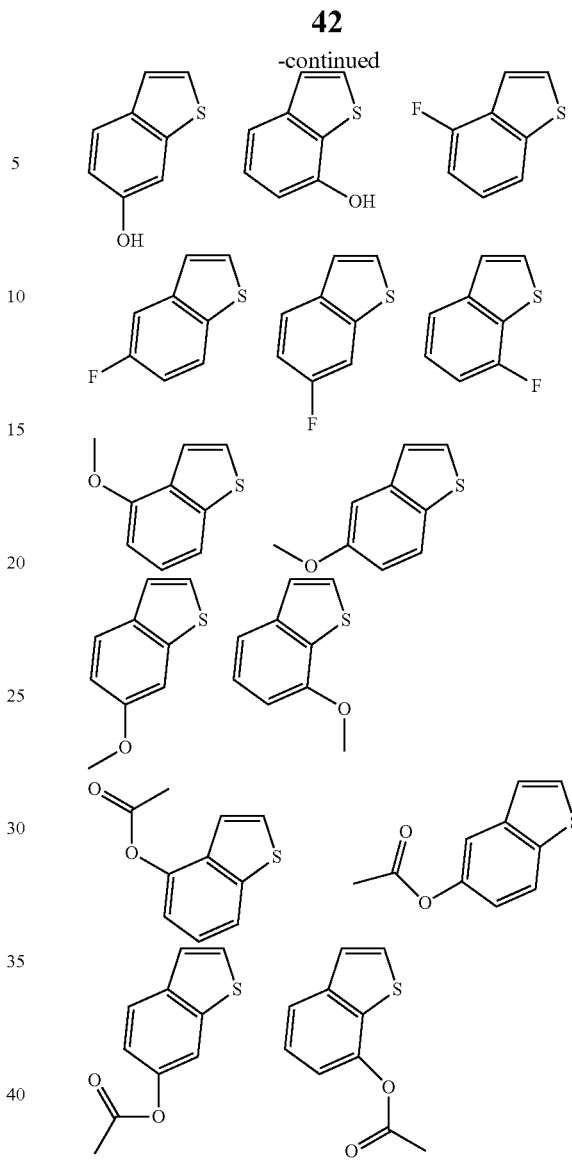

The dopant polymer of the component (B) may be synthesized, for example, by a method in which intended monomers to give the repeating units "a1" to "a4", "b", and "c" as mentioned above are subjected to thermal polymerization in the presence of a radical polymerization initiator in an organic solvent, thereby obtaining a (co)polymer of the dopant polymer.

Examples of the organic solvent to be used in the polymerization include toluene, benzene, tetrahydrofuran, diethyl ether, dioxane, cyclohexane, cyclopentane, methylethyl ketone, and γ-butyrolactone.

Examples of the radical polymerization initiator include 2,2'-azobisisobutyronitrile (AIBN), 2,2'-azobis(2,4-dimethylvaleronitrile), dimethyl 2,2'-azobis(2-methylpropionate), benzoylperoxide, and lauroylperoxide.

The reaction temperature is preferably in the range of 50 to 80° C.; and the reaction time is preferably in the range of 2 to 100 hours, more preferably 5 to 20 hours.

In the dopant polymer of the component (B), the monomer to give the repeating unit "a1" to "a4", "b", or "c" may be one kind or two or more kinds; and a combination of a methacryl type monomer and a styrene type monomer is preferable to enhance the polymerizability.

In the case that two or more kinds of the monomer to give the repeating unit "a1" to "a4", "b", or "c" are used, the respective monomers may be copolymerized randomly or as a block. When a block-copolymerized polymer (block copolymer) is formed, the sea-island structure is formed by agglomeration among the repeating unit portions composed of respective two or more repeating units of "a1" to "a4", "b", or "c", whereby generating a special structure around the dopant polymer; and as a result, the merit to enhance the conductivity may be expected.

The monomers to give the repeating units "a1" to "a4", "b", and "c" may be copolymerized randomly, or each of these may be copolymerized as a block. In this case, similarly to the case of the repeating unit "a1" to "a4", "b", or "c" as mentioned above, the merit to enhance the conductivity may be expected by forming a block copolymer.

In the case that the random copolymerization is carried out by a radical polymerization, the polymerization is generally performed by heating a mixture containing monomers to be copolymerized and a radical polymerization initiator. When the polymerization of a first monomer is initiated in the presence of a radical polymerization initiator and followed by addition of a second monomer, the resulting polymer has a structure that the first monomer is polymerized at one side of the polymer molecule, and the second monomer is polymerized at the other side. In this case, however, the repeating units of the first and second monomers are mixedly present at the middle portion, thus it has a different structure from the block copolymer. In order to form the block copolymer by radical polymerization, living radical polymerization is preferably used.

In a living radical polymerization method called RAFT polymerization (Reversible Addition Fragmentation chain Transfer polymerization), radicals at the polymer terminal are always living, so that it is possible to form a diblock copolymer composed of a block of the repeating unit of the first monomer and a block of the repeating unit of the second monomer by starting the polymerization with a first monomer, and then adding a second monomer at the time when the first monomer has been consumed. In addition, it is also possible to form a triblock copolymer by starting the polymerization with a first monomer, then adding a second monomer at the time when the first monomer has been consumed, and then adding a third monomer thereto.

The RAFT polymerization has the characteristic that the polymer having narrow molecular weight distribution (dispersity) can be obtained. In particular, when the RAFT polymerization is carried out by adding monomers all at once, a polymer having further narrower molecular weight distribution can be obtained.

Meanwhile, in the dopant polymer of the component (B), the molecular weight distribution (Mw/Mn) is preferably in the range of 1.0 to 2.0, particularly preferably in the range of narrower dispersity of 1.0 to 1.5. If the dispersity is narrow, transmittance of the conductive film which is formed from the conductive polymer material using this polymer can be prevented from lowering.

To carry out the RAFT polymerization, a chain transfer agent is necessary; and illustrative examples thereof include 2-cyano-2-propylbenzo thioate, 4-cyano-4-phenylcarbonothioyl thiopentanoic acid, 2-cyano-2-propyldodecyl trithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl(phenyl)carbamothioate, bis(thiobenzoyl)disulfide, and bis(dodecylsulfanylthiocarbonyl)disulfide. Among them, 2-cyano-2-propylbenzo thioate is especially preferable.

If the dopant polymer of the component (B) contains the repeating unit "c", the proportion of the repeating units "a1" to "a4", "b", and "c" is preferably in the range of $0<a1+a2+a3+a4\leq1.0$, $0<b\leq1.0$, and $0\leq c\leq1.0$, more preferably in the range of $0.1\leq a1+a2+a3+a4\leq0.9$, $0.1\leq b\leq0.9$, and $0\leq c\leq0.8$; and further preferably in the range of $0.2\leq a1+a2+a3+a4\leq0.8$, $0.2\leq b\leq0.8$, and $0\leq c\leq0.5$.

Also, it is preferred that $a1+a2+a3+a4+b+c=1$.

The weight-average molecular weight of the dopant polymer of the component (B) is in the range of 1,000 to 500,000, preferably 2,000 to 200,000. If the weight-average molecular weight is less than 1,000, the heat resistance is insufficient, and homogeneity of the composite solution with the component (A) becomes poor. On the other hand, if the weight-average molecular weight thereof is more than 500,000, not only the conductivity deteriorates but also the viscosity increases thereby deteriorating the workability and decreasing the dispersibility into water or into an organic solvent.

The weight-average molecular weight (Mw) is measured by a gel permeation chromatography (GPC) by using water, dimethyl formamide (DMF), or tetrahydrofuran (THF) as a solvent, in terms of polyethylene oxide, polyethylene glycol, or polystyrene.

As to the monomer to constitute the dopant polymer of the component (B), a monomer having a sulfo group may be used. Alternatively, a lithium salt, a sodium salt, a potassium salt, an ammonium salt, or a sulfonium salt of a sulfo group may be used as a monomer to perform a polymerization reaction, and after the polymerization, these salts may be converted into a sulfo group by an ion-exchange resin.

[(C) Amphoteric Ion Compound]

The conductive polymer material of the present invention contains an amphoteric ion compound represented by the following general formula (1) as component (C).

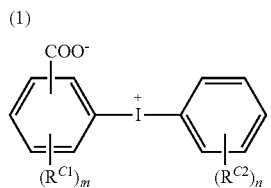

(1)

wherein $R^{C1}$ and $R^{C2}$ independently represent a linear, branched, or cyclic alkyl group having 1 to 10 carbon atoms, a linear, branched, or cyclic alkoxy group having 1 to 10 carbon atoms, an acyl group having 2 to 10 carbon atoms, an acyloxy group having 2 to 10 carbon atoms, an alkoxycarbonyl group having 2 to 10 carbon atoms, a hydroxyl group, a nitro group, a halogen atom; and "m" and "n" are each an integer of 0 to 4.

Illustrative examples of the amphoteric ion compound represented by the general formula (1) include the following compound.

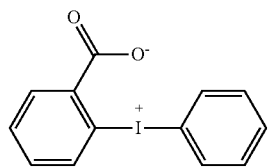

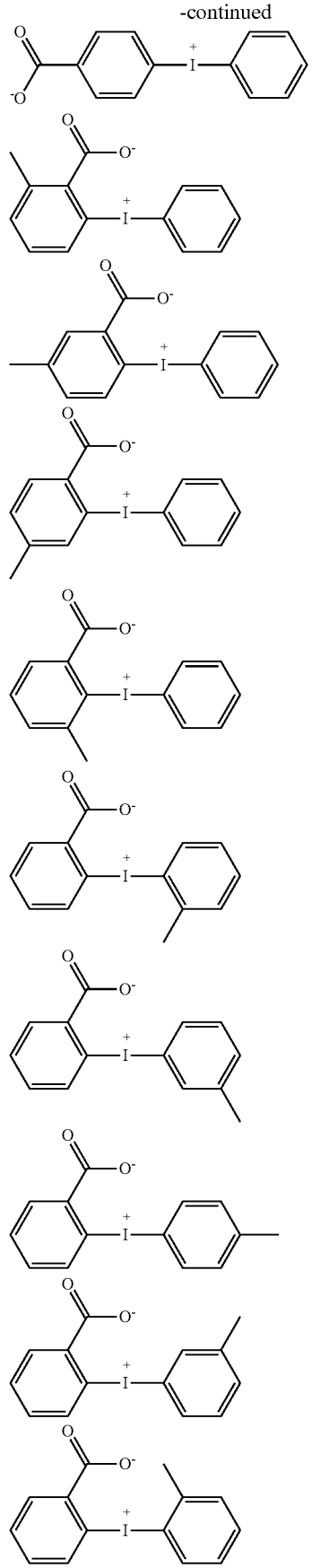
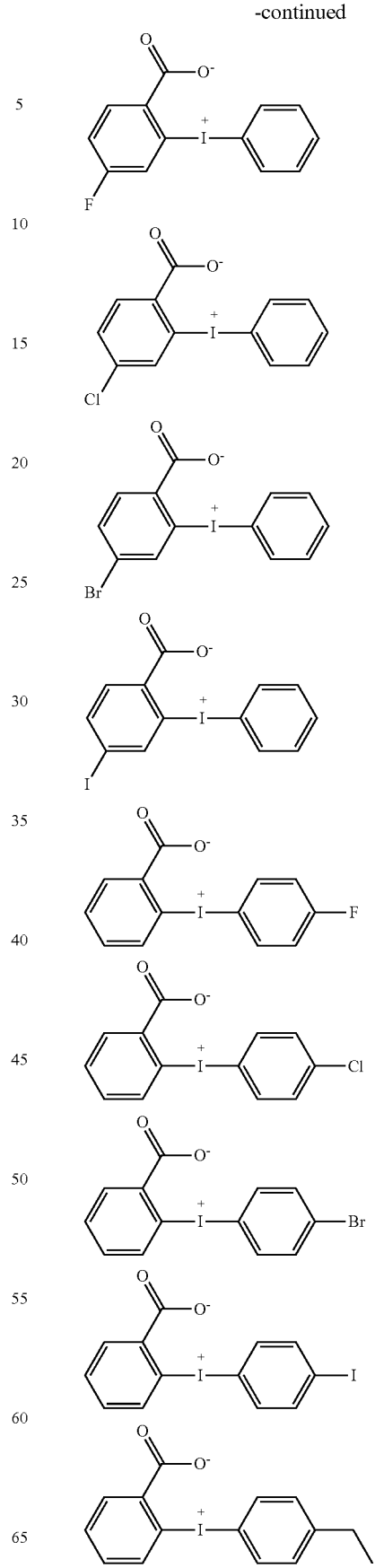

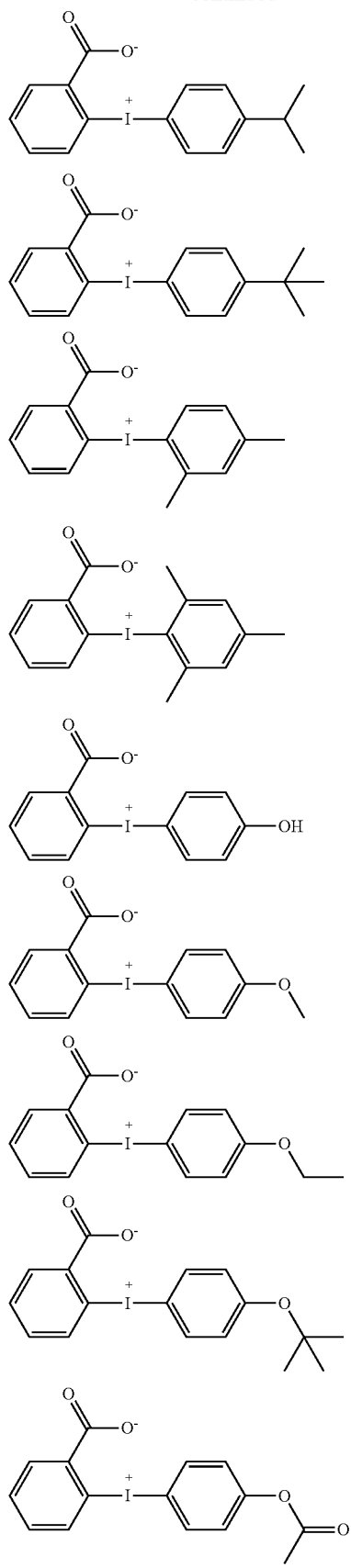
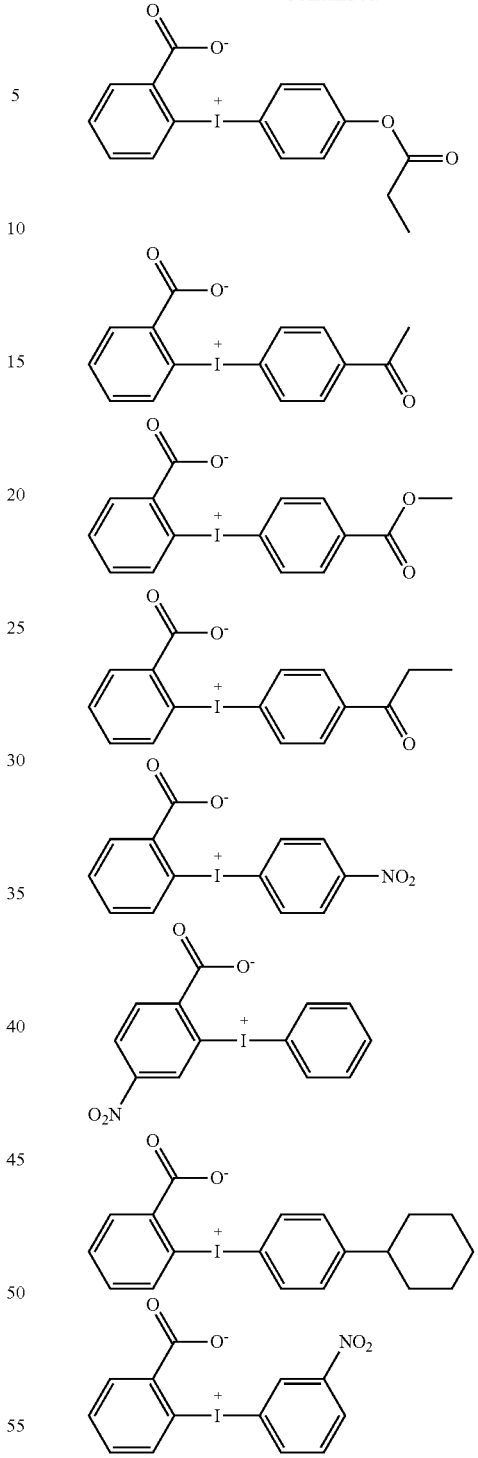

In the amphoteric ion compound of component (C), an iodonium and a carboxylate form a salt intramolecularly or intermolecularly. When this is added to the composite solution containing the π-conjugated polymer and the dopant polymer having a sulfo group, an excess sulfo group in the dopant polymer changes to a sulfonate ($SO_3^-$), and forms a salt with an iodonium, and thereby a carboxylate ($COO^-$) changes to a carboxyl group. The strongly acidic sulfo group is neutralized by forming a salt with the iodonium, and instead of that, the acidic group becomes a carboxyl group, accordingly the acidity is lowered.

In sulfonic acids, which have strong acidity, strong hydrogen-bonds are formed between their sulfo groups. This promotes the agglomeration of the composite particles (hereinafter also called conductive polymer composite) of the π-conjugated polymer and the dopant polymer having a sulfo group. However, the addition of the amphoteric ion compound of component (C) allows the acidic group to become a carboxyl group instead of a sulfo group, and thereby the hydrogen bond capability is lowered. Furthermore, since the portion in which the salt has been formed by the addition of the amphoteric ion compound of component (C) has both plus charges and minus charges, both attraction and repulsion work between the particles, and thereby the agglomeration among the particles is suppressed.

[Conductive Polymer Material]

The conductive polymer material of the present invention includes the above-mentioned π-conjugated polymer as component (A), the above-mentioned dopant polymer as component (B), and the above-mentioned amphoteric ion compound as component (C). The dopant polymer of the component (B) forms the composite by coordinating with the π-conjugated polymer of the component (A).

It is preferable that the conductive polymer material of the present invention have dispersibility in water or in an organic solvent; and if the conductive polymer material has such a dispersibility, the film-formability by spin coating onto an inorganic substrate or an organic substrate (i.e. substrate on which an inorganic film or an organic film has been formed) as well as the flatness of the film can be made excellent.

(Method for Producing the Conductive Polymer Material)

A method for producing the conductive polymer material (solution) of the present invention is not particularly limited. For example, it can be produced by addition of the amphoteric ion compound of component (C) to a composite solution containing the π-conjugated polymer of component (A) and the dopant polymer of component (B).

The composite of the components (A) and (B) may be obtained, for example, by adding a raw material monomer of the component (A) (preferably pyrrole, thiophene, aniline, or a derivative monomer thereof) into an aqueous solution of the component (B) or a water/organic solvent mixed solution of the component (B), and then adding an oxidant, or an oxidation catalyst depending on the situation, to perform an oxidative polymerization.

Illustrative examples of the oxidant and the oxidation catalyst include peroxodisulfate salts (i.e. persulfate salts) such as ammonium peroxodisulfate (i.e. ammonium persulfate), sodium peroxodisulfate (i.e. sodium persulfate), and potassium peroxodisulfate (i.e. potassium persulfate); transition metal compounds such as ferric chloride, ferric sulfate, and cupric chloride; metal oxides such as silver oxide and cesium oxide; peroxides such as hydrogen peroxide and ozone; organic peroxides such as benzoyl peroxide; and oxygen.

As the reaction solvent to be used for the oxidative polymerization, water or a mixture of water and a solvent may be used. The solvent to be used here is miscible with water and preferably can dissolve or disperse the component (A) and the component (B). Illustrative example thereof includes polar solvents such as N-methyl-2-pyrrolidone, N,N'-dimethyl formamide, N,N'-dimethyl acetamide, dimethyl sulfoxide, and hexamethyl phosphortriamide; alcohols such as methanol, ethanol, propanol, and butanol; polyvalent aliphatic alcohols such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol; carbonate compounds such as ethylene carbonate and propylene carbonate; cyclic ether compounds such as dioxane and tetrahydrofuran; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; heterocyclic compounds such as 3-methyl-2-oxazolidinone; and nitrile compounds such as acetonitrile, glutaronitrile, methoxyacetonitrile, propionitrile, and benzonitrile. These solvents may be used singly or as a mixture of two or more of them. The blending amount of these water-miscible solvents is preferably 50% by mass or less with respect to entirety of the reaction solvents.

Besides the dopant polymer of the component (B), another anion capable of being doped into the π-conjugated polymer of the component (A) may be used. As to the anion like this, an organic acid is preferable in view of controlling the characteristics, such as de-doping property from the π-conjugated polymer, dispersibility, heat resistance, environment resistance, and so forth of the conductive polymer material. Examples of the organic acid include an organic carboxylic acid, phenols, an organic sulfonic acid, etc.

As to the organic carboxylic acid, acids of aliphatic, aromatic, or alicyclic structure having one, or two or more carboxyl groups may be used. Illustrative examples thereof include formic acid, acetic acid, oxalic acid, benzoic acid, phthalic acid, maleic acid, fumaric acid, malonic acid, tartaric acid, citric acid, lactic acid, succinic acid, monochloro-acetic acid, dichloroacetic acid, trichloroacetic acid, trifluoroacetic acid, nitroacetic acid, and triphenyl-acetic acid.

Illustrative examples of the phenols include cresol, phenol, and xylenol.

As to the organic sulfonic acid, acids of aliphatic, aromatic, or alicyclic structure having one, or two or more sulfo groups may be used. Illustrative examples of the compound having one sulfo group include methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamide-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-acetamide-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, polycondensation product of naphthalenesulfonic acid and formalin, and polycondensation product of melaminesulfonic acid and formalin.

Illustrative examples of the compound containing two or more sulfo groups include ethane disulfonic acid, butane disulfonic acid, pentane disulfonic acid, decane disulfonic acid, m-benzene disulfonic acid, o-benzene disulfonic acid, p-benzene disulfonic acid, toluene disulfonic acid, xylene disulfonic acid, chlorobenzene disulfonic acid, fluorobenzene disulfonic acid, aniline-2,4-disulfonic acid, aniline-2,5-disulfonic acid, diethylbenzene disulfonic acid, dibutylbenzene disulfonic acid, naphthalene disulfonic acid, methylnaphthalene disulfonic acid, ethylnaphthalene disulfonic acid, dodecylnaphthalene disulfonic acid, pentadecylnaphthalene disulfonic acid, butylnaphthalene disulfonic acid, 2-amino-1,4-benzene disulfonic acid, 1-amino-3,8-naphthalene disulfonic acid, 3-amino-1,5-naphthalene disulfonic acid, 8-amino-1-naphthol-3,6-disulfonic acid, anthracene disulfonic acid, butylanthracene disulfonic acid, 4-acetamide-4'-isothio-cyanatostilbene-2,2'-disulfonic acid, 4-acetamide-4'-isothio-cyanatostilbene-2,2'-disulfonic acid, 4-acetamide-4'-maleimidylstilbene-2,2'-disulfonic acid, 1-acetoxypyrene-3,6,8-trisulfonic acid, 7-amino-1,3,6-naphthalene trisulfonic acid, 8-aminonaphthalene-1,3,6-trisulfonic acid, and 3-amino-1,5,7-naphthalene trisulfonic acid.

These anions other than the component (B) may be added, before polymerization of the component (A), into a solution containing a raw material monomer of the component (A), the component (B), and an oxidant and/or an oxidative polymerization catalyst. Alternatively, it may be added into the conductive polymer composite (solution) which contains the component (A) and the component (B) after the polymerization.

The composite including the component (A) and the component (B) thus obtained may be used after being pulverized by a homogenizer, a ball mill, or the like, if necessary.

For pulverization, a mixer/disperser which can apply a high shear force is preferably used. Illustrative examples of the mixer/disperser include a homogenizer, a high-pressure homogenizer, and a bead mill; among them, a high-pressure homogenizer is particularly preferable.

Illustrative examples of the high-pressure homogenizer include NanoVater (manufactured by Yoshida Kikai Co., Ltd.), Microfluidizer (manufactured by Powrex Corp.), and Ultimizer (manufactured by Sugino Machine Ltd.).

As the dispersion treatment using the high-pressure homogenizer, there may be mentioned a treatment in which the composite solutions before the dispersion treatment are collided from the opposite direction with each other under high pressure, or a treatment in which the solution is passed through an orifice or a slit under a high pressure.

Before or after the pulverization, impurities may be removed by the measures such as filtration, ultrafiltration, and dialysis; and also, purification may be done by using a cationic ion-exchange resin, an anionic ion-exchange resin, a chelate resin, or the like.

The total content of the component (A) and the component (B), and the component (C) as an additive in the conductive polymer material solution is preferably in the range of 0.05 to 10.0% by mass. If the total content of the component (A), the component (B), and the component (C) is 0.05% by mass or more, sufficient conductivity can be obtained; and if it is 10.0% by mass or less, the uniform conductive coating film can be readily obtained.

The content of the component (B) is preferably such an amount that the sulfo group in the component (B) is in the range of 0.1 to 10 mol, more preferably 1 to 7 mol, per 1 mol of the component (A). If the content of the sulfo group in the component (B) is 0.1 mol or more, the doping effect to the component (A) is so high that sufficient conductivity can be secured. On the other hand, if the content of the sulfo group in the component (B) is 10 mol or less, the content of the component (A) also becomes appropriate, so that sufficient conductivity can be obtained.

The content of the component (C) in the conductive polymer material solution is preferably such an amount that the component (C) is in the range of 0.01 to 50 mol, more preferably 0.1 to 20 mol, per 1 mol of the component (A). If the content of the component (C) is 0.01 mol or more, the agglomeration of the conductive polymer composite is suppressed. On the other hand, if the content of the component (C) is 20 mol or less, corrosion due to the strong acidity of the conductive polymer material solution can be sufficiently suppressed.

Illustrative examples of the organic solvent that can be added to the polymerization reaction aqueous solution or can dilute the monomers include alcohols such as methanol, ethanol, propanol, and butanol; polyvalent aliphatic alcohols such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, 1,9-nonanediol, and neopentyl glycol; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; cyclic ether compounds such as dioxane and tetrahydrofuran; polar solvents such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, N-methyl-2-pyrrolidone, N,N'-dimethylformamide, N,N'-dimethyl acetamide, dimethyl sulfoxide, and hexamethylene phosphortriamide; carbonate compounds such as ethylene carbonate and propylene carbonate; heterocyclic compounds such as 3-methyl-2-oxazolidinone; nitrile compounds such as acetonitrile, glutaronitrile, methoxyacetonitrile, propionitrile, and benzonitrile; and a mixture thereof.

The amount of the organic solvent to be used is preferably in the range of 0 to 1,000 mL, particularly preferably 0 to 500 mL, per 1 mol of the monomer. If the amount of the organic solvent is 1,000 mL or less, it is economical because the reaction vessel may not become too large.

[Other Additives]

(Surfactant)

In the present invention, a surfactant may be added to enhance the wettability to a body to be processed such as a substrate. As the surfactant, various surfactants of nonionic, cationic, and anionic type may be mentioned. Illustrative examples thereof include nonionic surfactants such as polyoxyethylene alkyl ether, polyoxyethylene alkyl phenyl ether, polyoxyethylene carboxylate, sorbitan ester, and polyoxyethylene sorbitan ester; cationic surfactants such as alkyltrimethylammonium chloride and alkylbenzylammonium chloride; anionic surfactants such as alkyl or alkylallyl sulfate salt, alkyl or alkylallyl sulfonate salt, and dialkyl sulfosuccinate salt; amphoteric surfactants such as an amino acid type and a betaine type; acetylene alcohol type surfactants; and an acetylene alcohol type surfactant whose hydroxyl group is polyethylene-oxidized or polypropylene-oxidized.

(Conductivity Enhancer)

In the present invention, an organic solvent other than the main solvent may be added to enhance the conductivity of the conductive polymer material. The additive solvent may be exemplified by a polar solvent, and illustrative examples thereof include ethylene glycol, diethylene glycol, polyethylene glycol, dimethyl sulfoxide (DMSO), dimethyl formamide (DMF), N-methyl-2-pyrrolidone (NMP), sulfolane, and a mixture thereof. The adding amount is preferably in the range of 1.0 to 30.0% by mass, particularly preferably 3.0 to 10.0% by mass.

(Neutralizer)

The present invention features the addition of the component (C) for neutralizing acidic pH of an aqueous solution of the conductive polymer material. However, other neutralizer can be added thereto in addition to this. For example, a nitrogen-containing aromatic cyclic compound described in paragraphs (0033) to (0045) of Japanese Patent Laid-Open Publication No. 2006-096975 or a cation described in paragraph (0127) of Japanese Patent No. 5264723 may be added to adjust the solution to neutral pH. By adjusting the pH of solution to near neutral, rust occurrence can be prevented when applied to a printer.

Thus, the conductive polymer material of the present invention as described above has low acidity, can suppress the agglomeration of the particles with the passage of time, and exhibits an excellent stability in a solution state.

[Conductive Film]

The conductive polymer material (solution) thus obtained can form a conductive film by applying it onto a body to be processed such as a substrate. Illustrative examples of the method of applying the conductive polymer material (solution) include coating by a spin coater, a bar coater, soaking, comma coating, spray coating, roll coating, screen printing, flexographic printing, gravure printing, and ink jet printing. After applying, heat treatment by using a hot-air circulating furnace, a hot plate, or the like, or irradiation with IR light, UV light, or the like may be carried out, whereby the conductive film can be formed.

As discussed above, the conductive polymer material of the present invention can form a conductive film by applying it onto a substrate or the like. In addition, the conductive film thus formed can be used as a transparent electrode layer and a hole injection layer because it has excellent conductivity and transparency.

In the conductive polymer material of the present invention, the amphoteric ion compound of the component (C) can be decomposed by exposure to a light having a wavelength of 140 to 400 nm or an electron beam after it is applied onto the substrate or the like to form a film thereon. By this operation, only the conductive polymer composite comprising the component (A) and the component (B) remains in the film, and thereby the conductivity is improved. Baking in a temperature range of 50 to 200° C. may be performed after the photo-exposure in order to vaporize the decomposed product.

[Substrate]

Also, the present invention provides a substrate having a conductive film formed thereon by using the conductive polymer material of the present invention.

Illustrative examples of the substrate include a glass substrate, a quartz substrate, a photomask blank substrate, a resin substrate, a silicon wafer, compound semiconductor wafers such as a gallium arsenic wafer and an indium phosphorous wafer, and a flexible substrate. In addition, it may also be used as an anti-static top coat by applying it onto a photoresist film.

As mentioned above, in the conductive polymer material of the present invention, the dopant polymer of the component (B) which contains a strongly acidic sulfo group forms the composite together with the π-conjugated polymer of the component (A), and moreover, the amphoteric ion compound of component (C) is added, whereby acidity of solution is lowered, the agglomeration of the particles with the passage of time can be suppressed, and low corrosiveness, low viscosity, excellent stability in a solution state, good filterability, and superior film-formability by spin coating are provided. In addition, when a film is formed from the inventive material, a conductive film excellent in transparency, flatness, smoothness, and conductivity as well as durability can be formed. Moreover, the conductivity can be improved by irradiation with a light after the film formation. Further, the above-mentioned conductive polymer material has excellent affinity to an organic solvent and an organic substrate, and excellent film-formability onto both an organic substrate and an inorganic substrate.

In addition, the conductive film formed by the above-mentioned conductive polymer material has excellent conductivity, transparency, and the like, so that this film may function as a transparent electrode layer.

EXAMPLES

Hereinafter, the present invention will be specifically described with reference to Synthesis Examples, Preparation Examples, Comparative Preparation Examples, Examples, and Comparative Examples, but the present invention is not restricted thereto.

Synthesis of Dopant Polymer

Synthesis Examples 1 to 15

Under nitrogen atmosphere, a monomer was dissolved in methanol stirred at 64° C., and to the obtained solution was added dropwise a solution in which dimethyl 2,2'-azobis (isobutyrate) had been dissolved in methanol, over 4 hours, followed by stirring for 4 hours. After cooling to room temperature, the mixture was added dropwise to ethyl acetate under vigorous stirring. The resulting solid was collected by filtration, and dried under vacuum at 50° C. for 15 hours. The resulting white polymer was dissolved in methanol, and then a cation of the monomer was exchanged with a hydrogen atom by ion-exchange resin to convert into a sulfo group.

In such a method, the following Dopant polymers 1 to 15 were obtained.

Dopant Polymer 1
Weight-average molecular weight (Mw)=46,000
Molecular weight distribution (Mw/Mn)=1.55

Dopant polymer 1

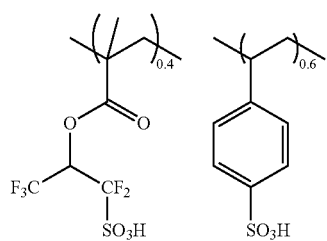

Dopant Polymer 2
  Weight-average molecular weight (Mw)=41,000
  Molecular weight distribution (Mw/Mn)=1.66

Dopant polymer 2

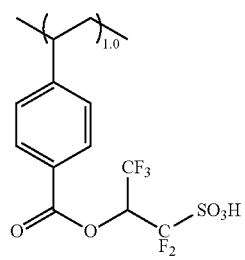

Dopant Polymer 3
  Weight-average molecular weight (Mw)=57,000
  Molecular weight distribution (Mw/Mn)=1.84

Dopant polymer 3

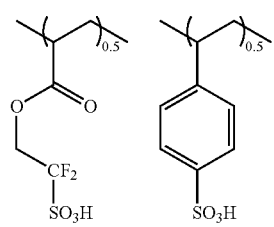

Dopant Polymer 4
  Weight-average molecular weight (Mw)=47,000
  Molecular weight distribution (Mw/Mn)=1.87

Dopant polymer 4

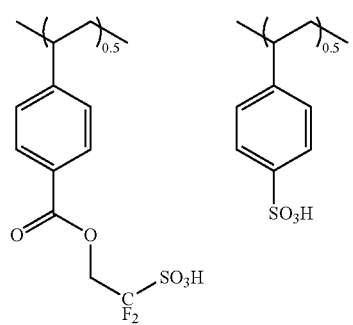

Dopant Polymer 5
  Weight-average molecular weight (Mw)=53,000
  Molecular weight distribution (Mw/Mn)=1.81

Dopant polymer 5

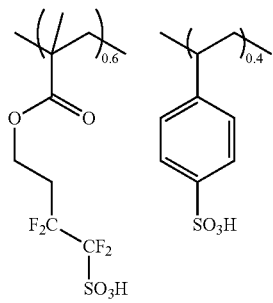

Dopant Polymer 6
  Weight-average molecular weight (Mw)=51,000
  Molecular weight distribution (Mw/Mn)=1.79

Dopant polymer 6

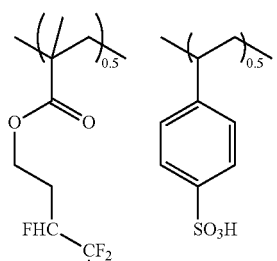

Dopant Polymer 7
  Weight-average molecular weight (Mw)=39,300
  Molecular weight distribution (Mw/Mn)=1.91

Dopant polymer 7

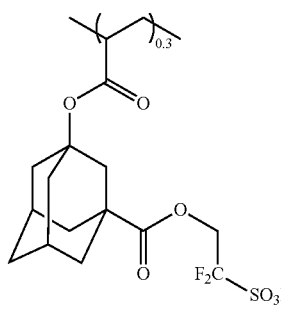

Dopant Polymer 8
  Weight-average molecular weight (Mw)=41,100
  Molecular weight distribution (Mw/Mn)=1.98

Dopant polymer 8

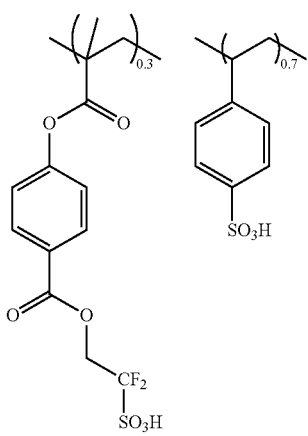

Dopant Polymer 9
Weight-average molecular weight (Mw)=51,000
Molecular weight distribution (Mw/Mn)=1.75

Dopant polymer 9

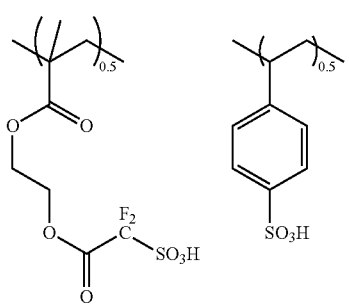

Dopant Polymer 10
Weight-average molecular weight (Mw)=51,000
Molecular weight distribution (Mw/Mn)=1.79

Dopant polymer 10

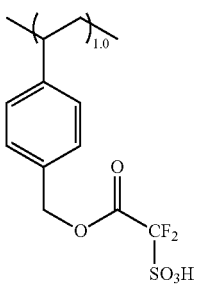

Dopant Polymer 11
Weight-average molecular weight (Mw)=33,100
Molecular weight distribution (Mw/Mn)=1.66

Dopant polymer 11

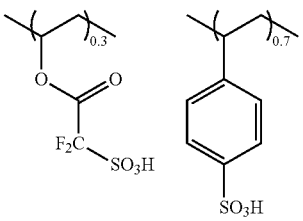

Dopant Polymer 12
Weight-average molecular weight (Mw)=42,100
Molecular weight distribution (Mw/Mn)=1.86

Dopant polymer 12

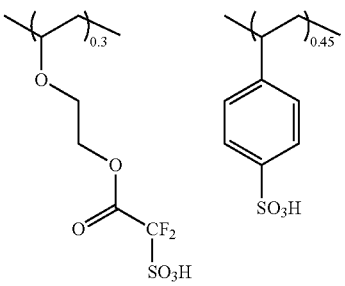 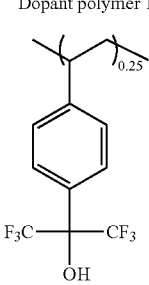

Dopant Polymer 13
Weight-average molecular weight (Mw)=42,000
Molecular weight distribution (Mw/Mn)=1.79

Dopant polymer 13

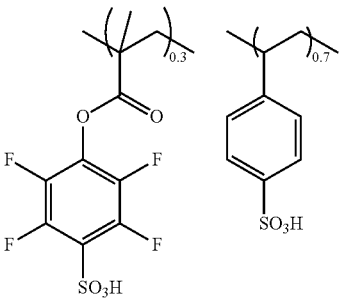

Dopant Polymer 14
Weight-average molecular weight (Mw)=21,000
Molecular weight distribution (Mw/Mn)=1.50

Dopant polymer 14

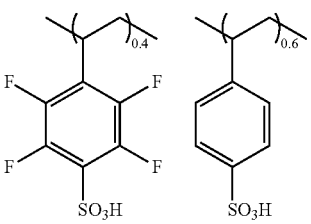

Dopant Polymer 15
Weight-average molecular weight (Mw)=44,000
Molecular weight distribution (Mw/Mn)=1.69

Dopant polymer 15

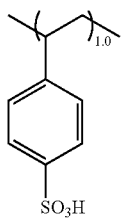

Preparation of Conductive Polymer Composite Dispersion Containing Polythiophene as π-Conjugated Polymer Preparation Example 1

A solution in which 12.5 g of Dopant polymer 1 had been dissolved in 1,000 mL of ultrapure water was mixed with 3.82 g of 3,4-ethylenedioxythiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration. After 2,000 mL of ion-exchanged water was added thereto, about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times to obtain Conductive polymer composite dispersion 1 having a blue color with a concentration of 1.3% by mass.

Conditions of the ultrafiltration were as follows.
Cut-Off Molecular Weight of the Ultrafiltration membrane: 30 K
Cross-Flow Method
Flow rate of the supply solution: 3,000 mL/min
Partial membrane pressure: 0.12 Pa Meanwhile, also in other Preparation Examples, the ultrafiltration was carried out with the same conditions.

Preparation Example 2

Procedure of Preparation Example 1 was repeated, except that 10.0 g of Dopant polymer 2 was used in place of 12.5 g of Dopant polymer 1, the blending amount of 3,4-ethylenedioxythiophene was changed to 2.41 g, the blending amount of sodium persulfate was changed to 5.31 g, and the blending amount of ferric sulfate was changed to 1.50 g, to obtain Conductive polymer composite dispersion 2.

Preparation Example 3

Procedure of Preparation Example 1 was repeated, except that 12.0 g of Dopant polymer 3 was used in place of 12.5 g of Dopant polymer 1, the blending amount of 3,4-ethylenedioxythiophene was changed to 2.72 g, the blending amount of sodium persulfate was changed to 6.00 g, and the blending amount of ferric sulfate was changed to 1.60 g, to obtain Conductive polymer composite dispersion 3.

Preparation Example 4

Procedure of Preparation Example 1 was repeated, except that 11.8 g of Dopant polymer 4 was used in place of 12.5 g of Dopant polymer 1, 4.50 g of ammonium persulfate was used in place of 8.40 g of sodium persulfate, the blending amount of 3,4-ethylenedioxythiophene was changed to 2.04 g, the blending amount of ferric sulfate was changed to 1.23 g, to obtain Conductive polymer composite dispersion 4.

Preparation Example 5

Procedure of Preparation Example 1 was repeated, except that 11.0 g of Dopant polymer 5 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 5.

Preparation Example 6

Procedure of Preparation Example 1 was repeated, except that 13.0 g of Dopant polymer 6 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 6.

Preparation Example 7

Procedure of Preparation Example 1 was repeated, except that 12.8 g of Dopant polymer 7 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 7.

Preparation Example 8

Procedure of Preparation Example 1 was repeated, except that 11.0 g of Dopant polymer 8 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 8.

Preparation Example 9

Procedure of Preparation Example 1 was repeated, except that 10.8 g of Dopant polymer 9 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 9.

Preparation Example 10

Procedure of Preparation Example 1 was repeated, except that 11.5 g of Dopant polymer 10 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 10.

Preparation Example 11

Procedure of Preparation Example 1 was repeated, except that 12.8 g of Dopant polymer 11 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 11.

Preparation Example 12

Procedure of Preparation Example 1 was repeated, except that 12.0 g of Dopant polymer 12 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 12.

Preparation Example 13

Procedure of Preparation Example 1 was repeated, except that 11.9 g of Dopant polymer 13 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 13.

Preparation Example 14

Procedure of Preparation Example 1 was repeated, except that 12.8 g of Dopant polymer 14 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 14.

Preparation Example 15

Procedure of Preparation Example 1 was repeated, except that 10.2 g of Dopant polymer 15 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 15.

Preparation Example 16

Procedure of Preparation Example 1 was repeated, except that 3.87 g of 3,4-dimethoxythiophene was used in place of 3.82 g of 3,4-ethylenedioxythiophene, to obtain Conductive polymer composite dispersion 16.

Preparation Example 17

Procedure of Preparation Example 1 was repeated, except that 4.62 g of (2,3-dihydrothieno[3,4-b][1,4]dioxin-2-yl)methanol was used in place of 3.82 g of 3,4-ethylenedioxythiophene, to obtain Conductive polymer composite dispersion 17.

Preparation Example 18

Procedure of Preparation Example 1 was repeated, except that 4.16 g of 3,4-propylenedioxythiophene was used in place of 3.82 g of 3,4-ethylenedioxythiophene, to obtain Conductive polymer composite dispersion 18.

EXAMPLES

Examples 1 to 18

20 g of each Conductive polymer composite dispersions 1 to 18 with a concentration of 1.3% by mass obtained in Preparation Examples 1 to 18 was mixed with 0.5 g of diphenyliodonium-2-carboxylate monohydrate, 5 g of dimethyl sulfoxide, and 0.5 g of Surfynol 465, which is a surfactant and defoamer. Then, the resulting mixture was filtrated by using a reproduced cellulose filter having a pore diameter of 0.45 μm (manufactured by Advantec MFS, Inc.) to prepare a conductive polymer material, followed by filtration through a reproduced cellulose filter having a pore diameter of 0.45 μm (manufactured by Advantec MFS, Inc.) and the respective materials were designated as Examples 1 to 18. The pH values of these obtained conductive polymer materials were shown in Table 1.

COMPARATIVE EXAMPLES

Comparative Example 1

20 g of Conductive polymer composite dispersion 15 with a concentration of 1.3% by mass obtained in Preparation Example 15 was mixed with 5 g of dimethyl sulfoxide, and 0.5 g of Surfynol 465, which is a surfactant and defoamer. Then, the resulting mixture was filtrated by using a reproduced cellulose filter having a pore diameter of 0.45 μm (manufactured by Advantec MFS, Inc.) to prepare a conductive polymer material, and the resulting material was designated as Comparative Example 1. The pH value of the resulting conductive polymer material was 2.0.

Comparative Example 2

20 g of Conductive polymer composite dispersion 15 with a concentration of 1.3% by mass obtained in Preparation Example 15 was mixed with 0.23 g of triethanolamine, 5 g of dimethyl sulfoxide, and 0.5 g of Surfynol 465, which is a surfactant and defoamer. Then, the resulting mixture was filtrated by using a reproduced cellulose filter having a pore diameter of 0.45 μm (manufactured by Advantec MFS, Inc.) to prepare a conductive polymer material, and the resulting material was designated as Comparative Example 2. The pH value of the resulting conductive polymer material was 6.1.

Comparative Example 3

20 g of Conductive polymer composite dispersion 15 with a concentration of 1.3% by mass obtained in Preparation Example 15 was mixed with 0.06 g of sodium hydroxide, 5 g of dimethyl sulfoxide, and 0.5 g of Surfynol 465, which is a surfactant and defoamer. Then, the resulting mixture was filtrated by using a reproduced cellulose filter having a pore diameter of 0.45 μm (manufactured by Advantec MFS, Inc.) to prepare a conductive polymer material, and the resulting material was designated as Comparative Example 3. The pH value of the resulting conductive polymer material was 6.2.
(Evaluation of Applicability Right after Filtration)

Firstly, the conductive polymer material was applied by spin coating onto a Si wafer by using 1H-360S SPIN-COATER (manufactured by MIKASA Co., Ltd.) so as to have a film thickness of 100±5 nm. Then, baking was performed for 5 minutes in an accuracy incubator at 120° C. to remove the solvent, thereby the conductive film was obtained. The refractive index (n and k) at a wavelength of 636 nm was measured with respect to the conductive film by using VASE (manufactured by J. A. Woollam Co., Inc.), a spectroscopic ellipsometer with the type of variable incident angle. If the uniform film could be formed, this is shown by "good", and if a defect derived from particles or a partial striation was found in the film although the measurement of the refractive index could be carried out, this is shown by "poor" in Table 1.
(Evaluation of Conductivity)

Firstly, 1.0 mL of the conductive polymer material was dropped onto a $SiO_2$ wafer having a diameter of 4 inches (100 mm). 10 seconds later, the whole wafer was spin-coated by using a spinner. The spin coating conditions were adjusted so as to give a film thickness of 100±5 nm. Then, baking was performed for 5 minutes in an accuracy incubator at 120° C. to remove the solvent, thereby the conductive film was obtained.

Further, the conductive film thus obtained was irradiated with an ultraviolet light having a wavelength of 254 nm with an exposure dose of 100 mJ/cm$^2$ by using a low pressure mercury lamp. Then, baking was performed for 90 seconds at 100° C.

The conductivities (S/cm) of the film after application and the film after photo-exposure were calculated from the surface resistivity ($\Omega/\square$) and film thickness measured by Hiresta-UP MCP-HT450 and Loresta-GP MCP-T610 (both are manufactured by Mitsubishi Chemical corp.). These results are shown in Table 1.
(Evaluation of Applicability after 1 Month at 23° C.)

The conductive polymer material thus obtained was stored in a solution state at 23° C. for 1 month, and then the generation of the agglomerate was evaluated. In addition, using the stored conductive polymer material, applicability was evaluated in the same way as in the foregoing evaluation of applicability right after filtration. These results are shown in Table 1.
[Evaluation of the Conductive Polymer Material Containing Polythiophene as the π-Conjugated Polymer]

TABLE 1

| | Conductive polymer composite | Amphoteric ion compound | pH | Applicability right after filtration | Conductivity after application (S/cm) | Conductivity after exposure (S/cm) | Applicability after 1 month at 23° C. |
|---|---|---|---|---|---|---|---|
| Example 1 | Preparation Example 1 | diphenyliodonium-2-carboxylate | 4.8 | good | 125 | 159 | good |
| Example 2 | Preparation Example 2 | diphenyliodonium-2-carboxylate | 3.9 | good | 95 | 122 | good |
| Example 3 | Preparation Example 3 | diphenyliodonium-2-carboxylate | 5.0 | good | 133 | 160 | good |
| Example 4 | Preparation Example 4 | diphenyliodonium-2-carboxylate | 4.9 | good | 139 | 170 | good |
| Example 5 | Preparation Example 5 | diphenyliodonium-2-carboxylate | 4.3 | good | 115 | 155 | good |
| Example 6 | Preparation Example 6 | diphenyliodonium-2-carboxylate | 4.5 | good | 129 | 156 | good |
| Example 7 | Preparation Example 7 | diphenyliodonium-2-carboxylate | 4.9 | good | 118 | 144 | good |
| Example 8 | Preparation Example 8 | diphenyliodonium-2-carboxylate | 4.8 | good | 110 | 140 | good |
| Example 9 | Preparation Example 9 | diphenyliodonium-2-carboxylate | 4.2 | good | 116 | 139 | good |
| Example 10 | Preparation Example 10 | diphenyliodonium-2-carboxylate | 3.7 | good | 90 | 140 | good |
| Example 11 | Preparation Example 11 | diphenyliodonium-2-carboxylate | 5.2 | good | 142 | 180 | good |
| Example 12 | Preparation Example 12 | diphenyliodonium-2-carboxylate | 5.5 | good | 90 | 150 | good |
| Example 13 | Preparation Example 13 | diphenyliodonium-2-carboxylate | 4.8 | good | 117 | 144 | good |
| Example 14 | Preparation Example 14 | diphenyliodonium-2-carboxylate | 4.9 | good | 132 | 179 | good |
| Example 15 | Preparation Example 15 | diphenyliodonium-2-carboxylate | 5.7 | good | 433 | 470 | good |
| Example 16 | Preparation Example 16 | diphenyliodonium-2-carboxylate | 4.8 | good | 144 | 210 | good |
| Example 17 | Preparation Example 17 | diphenyliodonium-2-carboxylate | 4.8 | good | 132 | 156 | good |

TABLE 1-continued

| | Conductive polymer composite | Amphoteric ion compound | pH | Applicability right after filtration | Conductivity after application (S/cm) | Conductivity after exposure (S/cm) | Applicability after 1 month at 23° C. |
|---|---|---|---|---|---|---|---|
| Example 18 | Preparation Example 18 | diphenyliodonium-2-carboxylate | 4.7 | good | 129 | 166 | good |
| Comparative Example 1 | Preparation Example 15 | — | 2.0 | good | 420 | 416 | poor striation |
| Comparative Example 2 | Preparation Example 15 | — | 6.1 | good | 60 | 58 | poor striation |
| Comparative Example 3 | Preparation Example 15 | — | 6.2 | good | 78 | 72 | poor striation |

As shown in Table 1, Examples 1 to 18, which contained polythiophene as the π-conjugated polymer, the dopant polymer having the repeating unit "a1" to "a4" or "b", and diphenyliodonium-2-carboxylate as the amphoteric ion compound showed low acidity, excellent conductivity, no generation of the agglomerate during the storage in a solution state, and excellent film-formability even after the storage for one month in a solution state. Furthermore, the iodonium salt was decomposed by the photo-exposure, and accordingly, the conductivity was improved.

On the other hand, Comparative Example 1, which did not contain diphenyliodonium-2-carboxylate, showed strong acidity though it had high conductivity. Furthermore, Comparative Examples 2 and 3, which did not contain diphenyliodonium-2-carboxylate, showed inferior conductivity compared with Examples 1 to 18, though they had low acidity. Moreover, all of Comparative Examples 1 to 3 showed inferior applicability after the storage for 1 month.

As described above, it was revealed that the conductive polymer material of the present invention exhibits low acidity, and can suppress the agglomeration of the particles with the passage of time, and also has excellent stability in a solution state.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:
1. A conductive polymer material comprising:
 (A) a π-conjugated polymer,
 (B) a dopant polymer which contains a repeating unit having a sulfo group and has a weight-average molecular weight in the range of 1,000 to 500,000, and
 (C) an amphoteric ion compound represented by the following general formula (1),

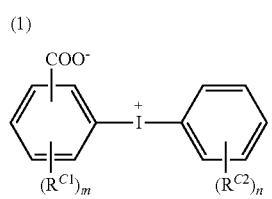

(1)

wherein $R^{C1}$ and $R^{C2}$ independently represent a linear, branched, or cyclic alkyl group having 1 to 10 carbon atoms, a linear, branched, or cyclic alkoxy group having 1 to 10 carbon atoms, an acyl group having 2 to 10 carbon atoms, an acyloxy group having 2 to 10 carbon atoms, an alkoxycarbonyl group having 2 to 10 carbon atoms, a hydroxyl group, a nitro group, a halogen atom; and "m" and "n" are each an integer of 0 to 4.

2. The conductive polymer material according to claim 1, wherein the component (B) contains either or both of an α-fluorinated sulfo group and a sulfo group bonded to a fluorinated aromatic group.

3. The conductive polymer material according to claim 2, wherein the component (B) contains one or more repeating units selected from (2-1) to (2-4) represented by the following general formula (2), (2)

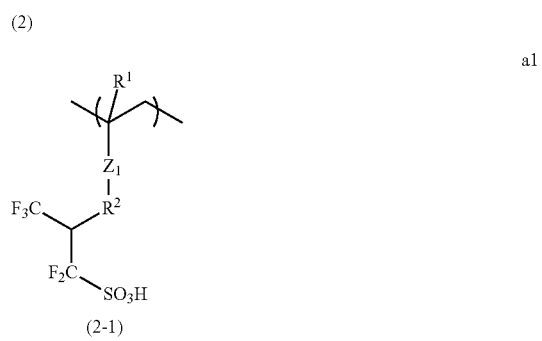

(2-1)

(2-2)

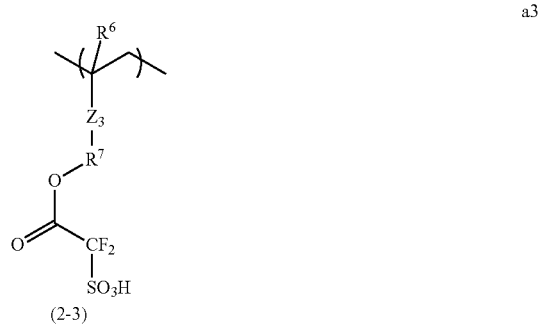

(2-3)

-continued

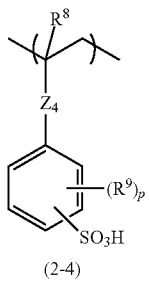
(2-4)

wherein $R^1$, $R^3$, $R^6$, and $R^8$ independently represent a hydrogen atom or a methyl group; $R^2$, $R^4$, and $R^7$ independently represent a single bond, an ester group, or a linear, branched, or cyclic hydrocarbon group having 1 to 12 carbon atoms and optionally containing either or both of an ether group and an ester group; $R^5$ represents a linear or branched alkylene group having 1 to 4 carbon atoms in which 1 or 2 hydrogen atoms in $R^5$ is optionally substituted with a fluorine atom; $R^9$ represents a fluorine atom or a trifluoromethyl group; $Z_1$ and $Z_2$ independently represent a phenylene group, a naphthylene group, or an ester group; $Z_3$ represents a single bond, a phenylene group, a naphthylene group, an ether group, or an ester group; $Z_4$ represents a single bond or an ester group; when $Z_2$ represents a phenylene group, $R^4$ contains no ether group; "p" is an integer of 1 to 4; and "a1", "a2", "a3", and "a4" are each a number satisfying $0 \leq a1 \leq 1.0$, $0 \leq a2 \leq 1.0$, $0 \leq a3 \leq 1.0$, $0 \leq a4 \leq 1.0$, and $0 < a1+a2+a3+a4 \leq 1.0$.

4. The conductive polymer material according to claim 3, wherein the component (B) further contains a repeating unit represented by the following general formula (3), (3)

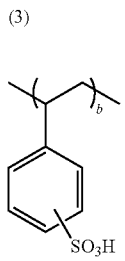

wherein "b" is a number satisfying $0 < b \leq 1.0$.

5. The conductive polymer material according to claim 3, wherein the component (B) is a block copolymer.

6. The conductive polymer material according to claim 3, wherein the component (A) is a polymer formed by polymerization of one or more precursor monomers selected from the group consisting of pyrrole, thiophene, selenophene, tellurophene, aniline, a polycyclic aromatic compound, and a derivative thereof.

7. The conductive polymer material according to claim 2, wherein the component (B) further contains a repeating unit represented by the following general formula (3), (3)

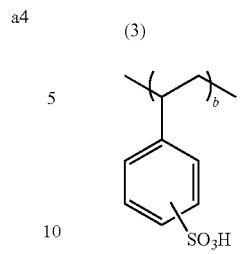

wherein "b" is a number satisfying $0 < b \leq 1.0$.

8. The conductive polymer material according to claim 2, wherein the component (B) is a block copolymer.

9. The conductive polymer material according to claim 2, wherein the component (A) is a polymer formed by polymerization of one or more precursor monomers selected from the group consisting of pyrrole, thiophene, selenophene, tellurophene, aniline, a polycyclic aromatic compound, and a derivative thereof.

10. The conductive polymer material according to claim 1, wherein the component (B) contains one or more repeating units selected from (2-1) to (2-4) represented by the following general formula (2), (2)

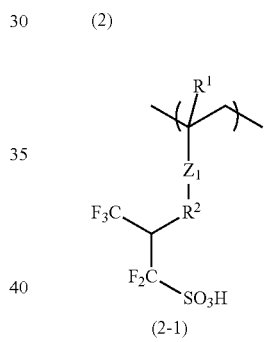
(2-1)

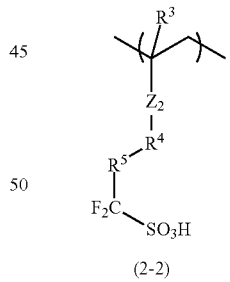
(2-2)

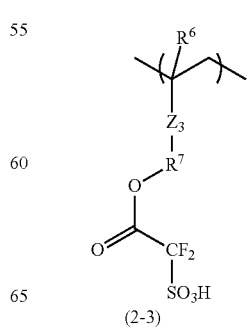
(2-3)

-continued

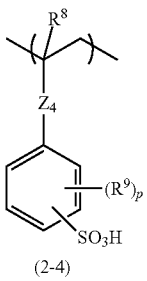

(2-4)

wherein $R^1$, $R^3$, $R^6$, and $R^8$ independently represent a hydrogen atom or a methyl group; $R^2$, $R^4$, and $R^7$ independently represent a single bond, an ester group, or a linear, branched, or cyclic hydrocarbon group having 1 to 12 carbon atoms and optionally containing either or both of an ether group and an ester group; $R^5$ represents a linear or branched alkylene group having 1 to 4 carbon atoms in which 1 or 2 hydrogen atoms in $R^5$ is optionally substituted with a fluorine atom; $R^9$ represents a fluorine atom or a trifluoromethyl group; $Z_1$ and $Z_2$ independently represent a phenylene group, a naphthylene group, or an ester group; $Z_3$ represents a single bond, a phenylene group, a naphthylene group, an ether group, or an ester group; $Z_4$ represents a single bond or an ester group; when $Z_2$ represents a phenylene group, $R^4$ contains no ether group; "p" is an integer of 1 to 4; and "a1", "a2", "a3", and "a4" are each a number satisfying $0 \leq a1 \leq 1.0$, $0 \leq a2 \leq 1.0$, $0 \leq a3 \leq 1.0$, $0 \leq a4 \leq 1.0$, and $0 < a1+a2+a3+a4 \leq 1.0$.

11. The conductive polymer material according to claim 10, wherein the component (B) further contains a repeating unit represented by the following general formula (3), (3)

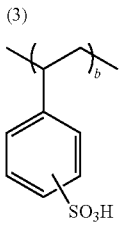

wherein "b" is a number satisfying $0 < b \leq 1.0$.

12. The conductive polymer material according to claim 10, wherein the component (B) is a block copolymer.

13. The conductive polymer material according to claim 10, wherein the component (A) is a polymer formed by polymerization of one or more precursor monomers selected from the group consisting of pyrrole, thiophene, selenophene, tellurophene, aniline, a polycyclic aromatic compound, and a derivative thereof.

14. The conductive polymer material according to claim 1, wherein the component (B) further contains a repeating unit represented by the following general formula (3), (3)

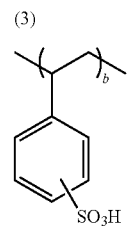

wherein "b" is a number satisfying $0 < b \leq 1.0$.

15. The conductive polymer material according to claim 1, wherein the component (B) is a block copolymer.

16. The conductive polymer material according to claim 1, wherein the component (A) is a polymer formed by polymerization of one or more precursor monomers selected from the group consisting of pyrrole, thiophene, selenophene, tellurophene, aniline, a polycyclic aromatic compound, and a derivative thereof.

17. The conductive polymer material according to claim 1, wherein the conductive polymer material has dispersibility in water or in an organic solvent.

18. A substrate having a conductive film formed thereon by using the conductive polymer material according to claim 1.

19. The substrate according to claim 18, wherein the conductive film is formed by application of the conductive polymer material onto the substrate and subsequent exposure by a light having a wavelength of 140 to 400 nm or an electron beam.

20. The substrate according to claim 18, wherein the conductive film functions as a transparent electrode layer.

* * * * *